(12) United States Patent
Hemati

(10) Patent No.: US 10,158,313 B2
(45) Date of Patent: Dec. 18, 2018

(54) CURRENT CONTROLLER FOR CRYOGENICALLY COOLED MOTOR

(71) Applicant: Nikon Corporation, Tokyo (JP)

(72) Inventor: Neyram Hemati, Saratoga, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 15/294,615

(22) Filed: Oct. 14, 2016

(65) Prior Publication Data

US 2017/0111002 A1  Apr. 20, 2017

Related U.S. Application Data

(60) Provisional application No. 62/241,947, filed on Oct. 15, 2015.

(51) Int. Cl.

| | |
|---|---|
| *H02P 25/06* | (2016.01) |
| *H02K 41/02* | (2006.01) |
| *H02K 41/035* | (2006.01) |
| *H02K 9/20* | (2006.01) |
| *H02J 7/00* | (2006.01) |
| *G03F 7/20* | (2006.01) |
| *H02J 7/34* | (2006.01) |
| *H02J 50/10* | (2016.01) |

(52) U.S. Cl.
CPC .......... *H02P 25/06* (2013.01); *G03F 7/70725* (2013.01); *G03F 7/70758* (2013.01); *H02J 7/0013* (2013.01); *H02J 7/345* (2013.01); *H02J 50/10* (2016.02); *H02K 9/20* (2013.01); *H02K 41/02* (2013.01); *H02K 41/0354* (2013.01)

(58) Field of Classification Search
CPC . G03F 7/70725; G03F 7/70758; H02K 41/02; H02K 41/0354; H02P 25/06
See application file for complete search history.

(56) References Cited

U.S. PATENT DOCUMENTS

| | | | |
|---|---|---|---|
| 5,276,372 A * | 1/1994 | Hammer | H02K 55/00 310/16 |
| 8,853,988 B2 | 10/2014 | Binnard et al. | |
| 2005/0231706 A1* | 10/2005 | Yang | G03F 7/70725 355/72 |
| 2007/0090782 A1* | 4/2007 | Endo | B62D 5/046 318/432 |
| 2010/0222898 A1* | 9/2010 | Yang | G03F 7/70725 700/29 |

* cited by examiner

*Primary Examiner* — Muhammad S Islam
(74) *Attorney, Agent, or Firm* — Klarquist Sparkman, LLP

(57) ABSTRACT

Current amplitudes in a motor can be controlled by summing a first signal indicative of an output current of the motor with a current command signal, integrating the current command signal with respect to time, and applying a first controller gain to a second signal indicative of the output current of the motor to obtain a gain-controlled signal indicative of the output current of the motor. The method further includes applying a second controller gain to the current command signal to obtain a gain-controlled current command signal, summing the gain-controlled signal indicative of the output current of the motor with the gain-controlled current command signal to obtain a voltage signal, and inputting the voltage signal to the motor such that current amplitudes in the motor are controlled.

20 Claims, 19 Drawing Sheets

CURRENT CONTROLLER FOR CRYOGENICALLY COOLED MOTOR

CROSS REFERENCE TO RELATED APPLICATION

This application claims priority to and the benefit of U.S. Provisional Patent Application No. 62/241,947, filed Oct. 15, 2015, which is incorporated herein by reference in its entirety.

FIELD

This disclosure pertains to systems and methods of applying electric currents to cryogenically cooled motors, and systems for storing energy on a wafer stage.

BACKGROUND

High-precision systems are useful for precisely and accurately positioning workpieces and/or tools using a movable platform or stage. For example, high-precision platforms are used in manufacturing and inspection systems in which precise movements are necessary for positioning a workpiece. Examples of such high-precision systems are microlithography systems that utilize a movable stage assembly for holding and controllably moving a lithographic substrate relative to an imaging optical system. Stage motions are typically effected using linear motors or planar motors in which a coil array interacts with a magnet array to produce motion of the stage relative to the base. Such motors can be cooled to cryogenic temperatures to reduce the resistance in the coils, thereby reducing heat generation in the precision system. However, this can affect the time constant of the coils and, consequently, the stability margin of the system, the current amplitude response, and the force output of the coils. Accordingly, improved devices and methods of controlling current in cryogenically cooled motors are desirable.

Utilities such as power, vacuum, water, etc., are typically supplied to a wafer stage by one or more cables and/or hoses pendantly extending from the wafer stage to a frame body of the precision system. Such cables and hoses impart disturbances on the wafer stage, which can negatively impact the precision and accuracy of stage movements. Accordingly, improved devices and methods of reducing the disturbances imparted to the stage by pendant cables and hoses is also desirable.

SUMMARY

Certain embodiments of the disclosure relate to systems and methods of controlling current amplitudes in a motor. In a representative embodiment, a method for controlling a motor comprises summing a first signal indicative of an output current of the motor with a current command signal, integrating the current command signal with respect to time, and applying a first controller gain to a second signal indicative of the output current of the motor to obtain a gain-controlled signal indicative of the output current of the motor. The method further comprises applying a second controller gain to the current command signal to obtain a gain-controlled current command signal, summing the gain-controlled signal indicative of the output current of the motor with the gain-controlled current command signal to obtain a voltage signal, and inputting the voltage signal to the motor such that current amplitudes in the motor are controlled.

In another representative embodiment, a system comprises a motor, and a controller. The controller comprises a summing junction operable to sum a signal indicative of an output current of the motor with a current command signal, an integration module operable to integrate the current command signal with respect to time, and a first gain module to apply a first controller gain to the signal indicative of the output current of the motor to obtain a gain-controlled signal indicative of the output current of the motor. The controller further comprises a second gain module to apply a second controller gain to the output of the current command module to obtain a gain-controlled current command signal, and a second summing junction to sum the gain-controlled signal indicative of the output current of the motor with the gain-controlled current command signal to compensate for back electromotive force generated in the motor and output a voltage signal to the motor.

Certain other embodiments of the disclosure concern devices and systems for powering a stage body of a precision system. In a representative embodiment, an assembly for positioning an object comprises a movable stage body, a base adapted to cooperate with the stage body to apply a force to the stage body, and a charging element electrically connectable with the stage body. The stage body includes a capacitor network to power one or more stage electrical loads when the stage body is disconnected from the charging element and receive electrical power from the charging element when the stage is electrically connected to the charging element.

The foregoing and other objects, features, and advantages of the disclosed technology will become more apparent from the following detailed description, which proceeds with reference to the accompanying figures.

DETAILED DESCRIPTION

First Representative Embodiment

Figure 1:
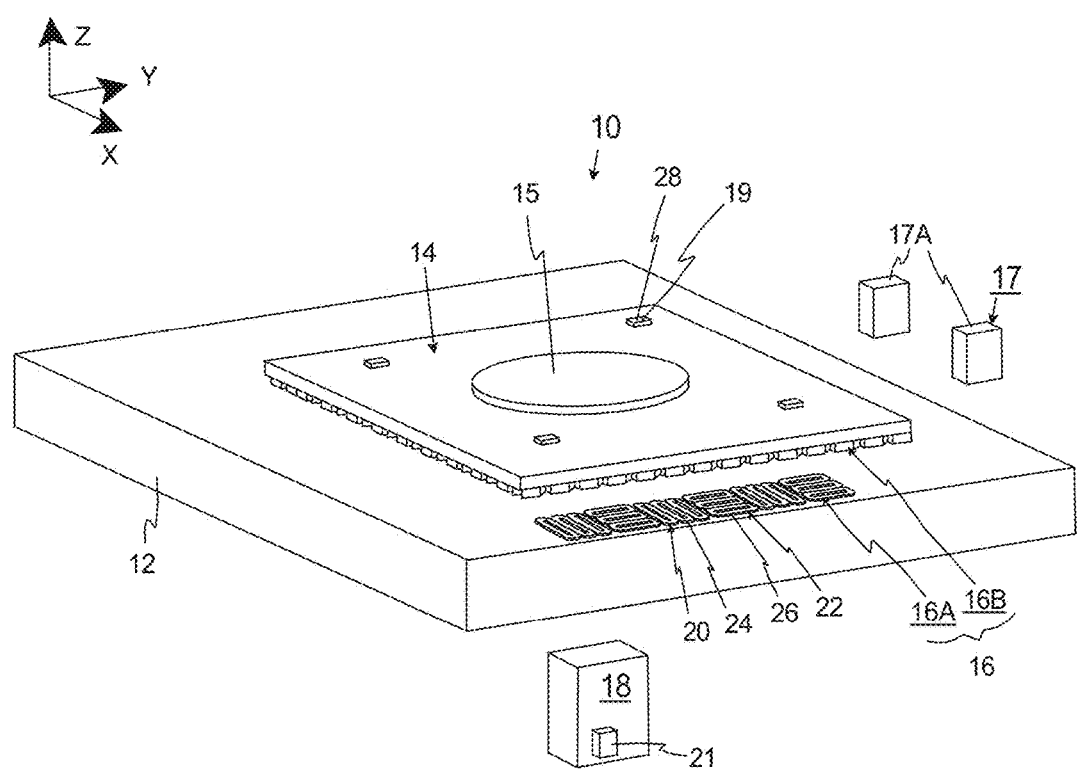
FIG. 1 is a perspective view of an exemplary embodiment of stage assembly.

Referring initially to FIG. 1, an exemplary embodiment of a stage assembly 10 includes a base 12, a stage body 14 that retains a device 15 (also referred to as a "workpiece"), a stage mover assembly 16 that moves and positions the stage 14 and the device 15, a stage body measurement system 17 (schematically illustrated as block elements) that measures the position and/or movement of the stage 14, a control system 18 that controls the stage mover assembly 16, and a flexible mode sensor assembly 19 that is used to determine and monitor one or more flexible modes of the stage 14. The design of each of these components can be varied to suit the design requirements of the stage assembly 10.

Some of the figures provided herein include an orientation system that designates the X-axis, the Y-axis, and the Z-axis that are orthogonal to each other. In these Figures, the Z-axis is oriented in the vertical direction. It should be understood that the orientation system is merely for reference and can be varied. For example, the X-axis can be switched with the Y-axis and/or the stage assembly 10 can be rotated. Moreover, these axes can alternatively be referred to as first, second, or third axes. For example, the X-axis can be referred to as the first axis, the Y-axis can be referred to as the second axis, and the Z-axis can be referred to as the third axis.

The stage assembly 10 is particularly useful for precisely positioning the device 15 during a manufacturing and/or an inspection process. The type of device 15 positioned and moved by the stage assembly 10 can be, for example, a semiconductor wafer, and the stage assembly 10 can be used as part of an exposure apparatus for precisely positioning the semiconductor wafer during manufacturing of semiconductor devices on the wafer. Alternatively, for example, the stage assembly 10 can be used to move other types of devices during manufacturing and/or inspection, to move a device under an electron microscope, or to move a device during a precision measurement operation.

The base 12 can be coupled to a portion of the stage mover assembly 16, can receive the reaction forces generated by the stage mover assembly 16, and can be any suitable structure. In certain embodiments, the base 12 can be a reaction assembly that counteracts, reduces, and minimizes the influence of the reaction forces from the stage mover assembly 16 on the position of other structures on the exposure apparatus. For example, the base 12 can be a rigid, rectangular shaped countermass that is maintained above a countermass support (not shown) with a reaction bearing (not shown) that allows for motion of the base 12 relative to the countermass support along the X-axis, along the Y-axis, and about the Z-axis. For example, the reaction bearing can be a vacuum preload type fluid bearing, a magnetic type bearing, or a roller bearing type assembly. In some embodiments, the reaction bearing can also allow motion of the base 12 along the Z-axis, about the X-axis, and/or about the Y-axis. Alternatively, for example, the stage assembly 10 can include a reaction frame that couples the base 12 to another structure.

With the present exemplary design, (i) movement of the stage 14 with the stage mover assembly 16 along the X-axis, generates an equal and opposite X reaction force that moves the base 12 in the opposite direction along the X-axis; (ii) movement of the stage 14 with the stage mover assembly 16 along the Y-axis, generates an equal and opposite Y reaction force that moves the base 12 in the opposite direction along the Y-axis; (iii) movement of the stage 14 with the stage mover assembly 16 about the Z-axis generates an equal and opposite theta Z reaction moment (torque) that moves the base 12 about the Z-axis; and (iv) depending on the position of the stage 14, movement of the stage 14 with the stage mover assembly 16 along the X-axis or along the Y-axis may generate a theta Z reaction moment (torque) that rotates the base 12 about the Z-axis. In one embodiment, the stage assembly 10 includes a single stage 14 that is moved relative to the stage base 12. However, in alternative embodiments, the stage assembly 10 can be designed to include multiple stages that are independently movable relative to the base 12. In some embodiments, the inertia of the stage base 12 is substantially greater than the inertia of the stage 14, so the reaction movement of the stage base is proportionately smaller than the motion of the stage 14.

In FIG. 1, the stage 14 retains the device 15. The design of the stage 14 can be varied greatly to suit the design requirements of the stage 14. In the representative embodiment illustrated in FIG. 1, the stage 14 is monolithic and can include a device holder (not shown) for retaining the device 15. The device holder can be, for example, a vacuum chuck, an electrostatic chuck, or some other type of clamp.

The stage mover assembly 16 controls and adjusts the position of the stage 14 and the device 15 relative to the base 12 aided at least in part by, for example, the measurement system 17. For example, the stage mover assembly 16 can be a planar motor that moves and positions the stage 14 with six degrees of freedom (e.g., motion along the X-, Y-, and Z-axes, and rotation about the X-, Y-, and Z-axes) relative to the base 12. Alternatively, the stage mover assembly 16 can be designed to move the stage 14 with fewer than six degrees of freedom (e.g., with three degrees of freedom). In certain embodiments, the stage mover assembly 16 may comprise a plurality of linear motors, voice coil motors, other actuators, or combinations thereof.

In the illustrated embodiment, the stage mover assembly 16 includes a conductor assembly or array 16A (only a portion is illustrated in FIG. 1), and a magnet assembly or array 16B positioned adjacent the conductor assembly (or coil array) 16A. Moreover, one of the assemblies 16A, 16B can be secured to the stage 14 while the other of the assemblies can be secured to the base 12. In the embodiment of FIG. 1, the conductor assembly 16A is secured to the base 12 and the magnet assembly 16B is secured to the stage 14 (known as a "moving magnet" design). For a moving magnet design, the conductor assembly 16A is larger along the X- and/or Y-axes than the magnet assembly 16B. In embodiments where the coil assembly is secured to the stage (known as "moving coil" designs), the magnet assembly 16B secured to the base 12 is larger along the X- and/or Y-axes than the conductor assembly 16A secured to the stage 14.

In the illustrated embodiment, the conductor assembly 16A includes a plurality of X conductor units 20 and a plurality of Y conductor units 22. In certain embodiments, the X conductor units 20 can be arranged in an alternating fashion with the Y conductor units 22 along the X-axis and along the Y-axis to create a checkerboard pattern. As shown in FIG. 1, each X conductor unit 20 includes a plurality of X coils 24 that are positioned side-by-side along the X-axis, and each Y conductor unit 22 includes a plurality of Y coils 26 that are positioned side-by-side along the Y-axis. For example, each coil unit 20, 22 can include three coils 24, 26, respectively, often referred to as a U coil, V coil, and W coil. Further, in certain embodiments, all of the conductor units 20, 22 are attached to the top of the base 12, are in substantially the same plane, and have the same Z-axis position. With this design, the coils 24, 26 are organized in a two dimensional planar array.

Further, the magnet assembly 16B can include a plurality of magnets that are attached to the bottom of the stage 14, that are in substantially the same plane and have substantially the same Z-axis position. In some embodiments, the plurality of magnets can be arranged in a somewhat checkerboard pattern in which adjacent magnets have a different polarity (e.g. alternating between the south pole facing the conductor assembly 16A and the north pole facing the conductor assembly 16A). In some embodiments, the magnet assembly 16B can comprise one or more sub-assemblies that comprise a linear array of magnets with alternating polarity. In either checkerboard or linear configurations of the magnet assembly 16B, Halbach magnet arrays may be used to improve the efficiency of the stage mover assembly 16.

The measurement system 17 can monitor the position and/or movement of the stage 14 relative to a reference and provide a measurement signal to the control system 18. With this information and information from the sensor assembly 19, the control system 18 can control the stage mover assembly 16 to precisely position the device 15. For example, the measurement system 17 can include one or more sensors schematically illustrated at 17A (two are illustrated in FIG. 1) such as encoders, interferometers, autofocus systems, and/or other measuring devices.

For the six degree of freedom mover illustrated in FIG. 1, the measurement system 17 can provide at least six degrees of measurement information of the physical position of stage 14 to control the position of the stage 14 for the six degrees of freedom. For example, in an exemplary embodiment, the measurement system 17 can utilize six or more rigid body sensors 17A.

The control system 18 is electrically connected and directs and controls electrical current to the conductor assembly 16A of the stage mover assembly 16 to precisely position the device 15 using the measurement signals from the measurement system 17 and the sensor signals from the sensor assembly 19, in combination with other information. The control system 18 can include one or more processors 21 (see also FIG. 19) and programs that perform the functionality described herein. With a moving magnet planar motor 16, the control system 18 directs current to a plurality of coils 24, 26 to energize them. With this design, the overall motor forces generated on the stage 14 are contributed from each of individual energized coils 24, 26, which interact with the magnet assembly 16B to generate six degree of freedom forces on the stage 14. Stated in another fashion, each individual energized coil 24, 26 (which interacts with the magnet assembly 16B) can generate, in general, forces on the stage 14 along any of the X-, Y-, and/or Z-axes and moments (torques) about any of the X-, Y-, or Z-axes. The control system 18 adjusts the current to the coils 24, 26 of the conductor array 16A to apply net force(s) and moment(s) to the stage 14 to control the position and/or orientation of the stage, and to produce motion of the stage along a prescribed trajectory.

In certain embodiments, the conductor units 20, 22 can be cooled, for example, to cryogenic temperatures to reduce power consumption of the motor 16 and, thereby, heat generation in the system. Such cooling can be carried out, for example, using liquid nitrogen or other suitable liquefied gases. In this manner, the temperature of the conductor units can be lowered to around 70 K, in certain examples.

In general, a coil winding can be modeled as an RL circuit, where R is the resistance of the coil and L is the inductance. As the temperature of the conductor units is lowered, the resistance R of the individual coil windings 24, 26 can be correspondingly reduced. Thus, in the example where the coils are cooled to about 70 K, the resistance R of the coils can be about 8 to 10 times lower than at room temperature. This, in turn, can affect the time constant r of the coil windings, defined below in Equation 1.

$$\tau = \frac{L}{R} \quad (1)$$

Figure 2:
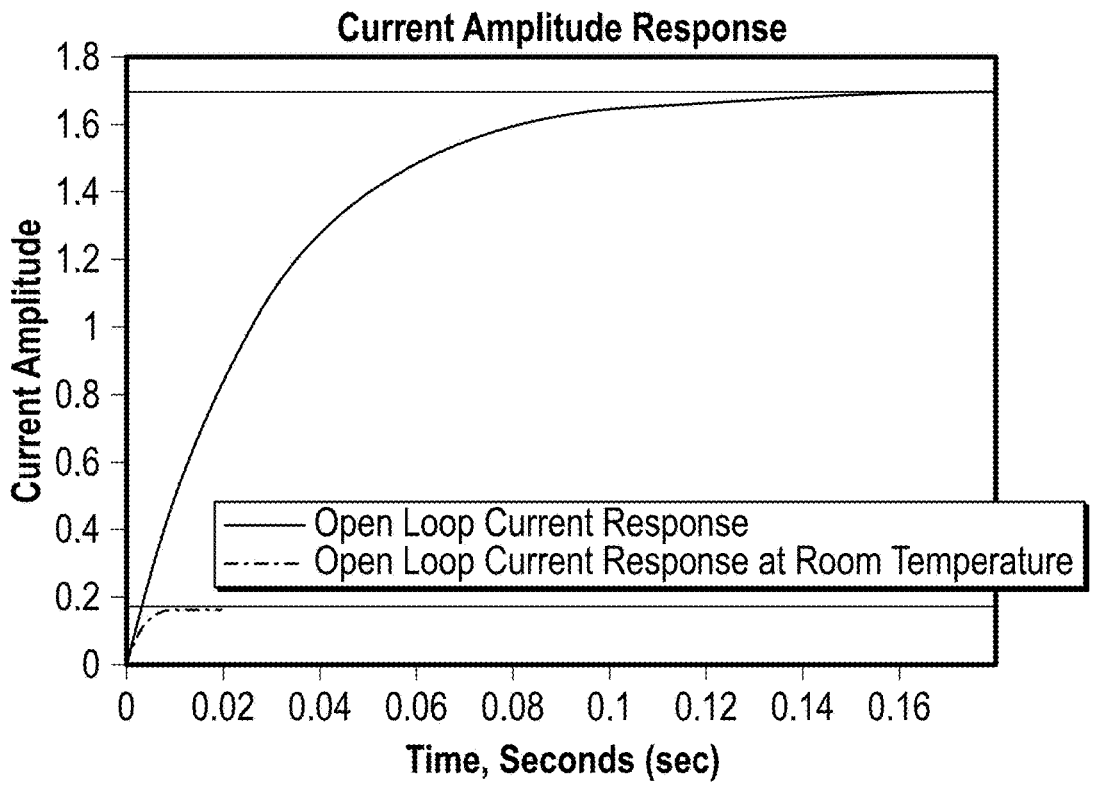
FIG. 2 is a plot illustrating the open-loop current amplitude response of a coil winding at cryogenic temperatures as compared to room temperature for an input of 1 V.

Generally, the inductance L of the coil is not significantly affected by changes in temperature. Thus, as the resistance R of the coil is reduced at cryogenic temperatures, the time constant r increases in a corresponding manner, for example, by 8 to 10 times at about 70 K, as compared to room temperature. This can affect various parameters of coil and/or motor performance, such as the amount of current generated in the coil for a given input voltage, the phase margin or stability margin of the system, and the amount of overshoot and settling time of the current amplitude response. FIG. 2 illustrates the open-loop current amplitude response for a coil winding at cryogenic temperatures versus room temperature for an input of 1 V, wherein the cooled winding produces a steady-state output of more than 1.7 amps, and the coil winding at room temperature produces a steady-state output of less than 0.2 amps.

Figure 3:
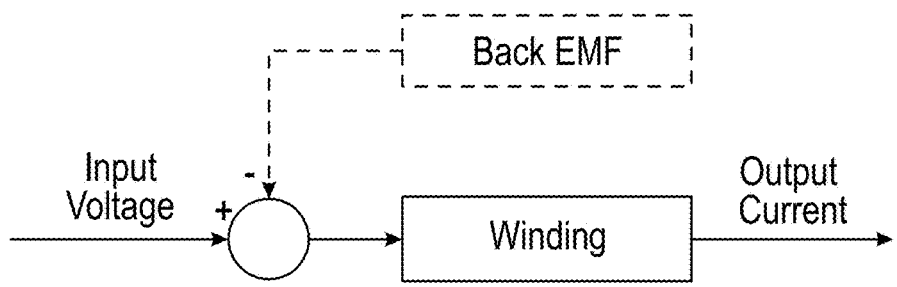
FIG. 3 is a schematic block diagram illustrating the effect of back electromotive force (BEMF) on a coil winding.
Figure 4:
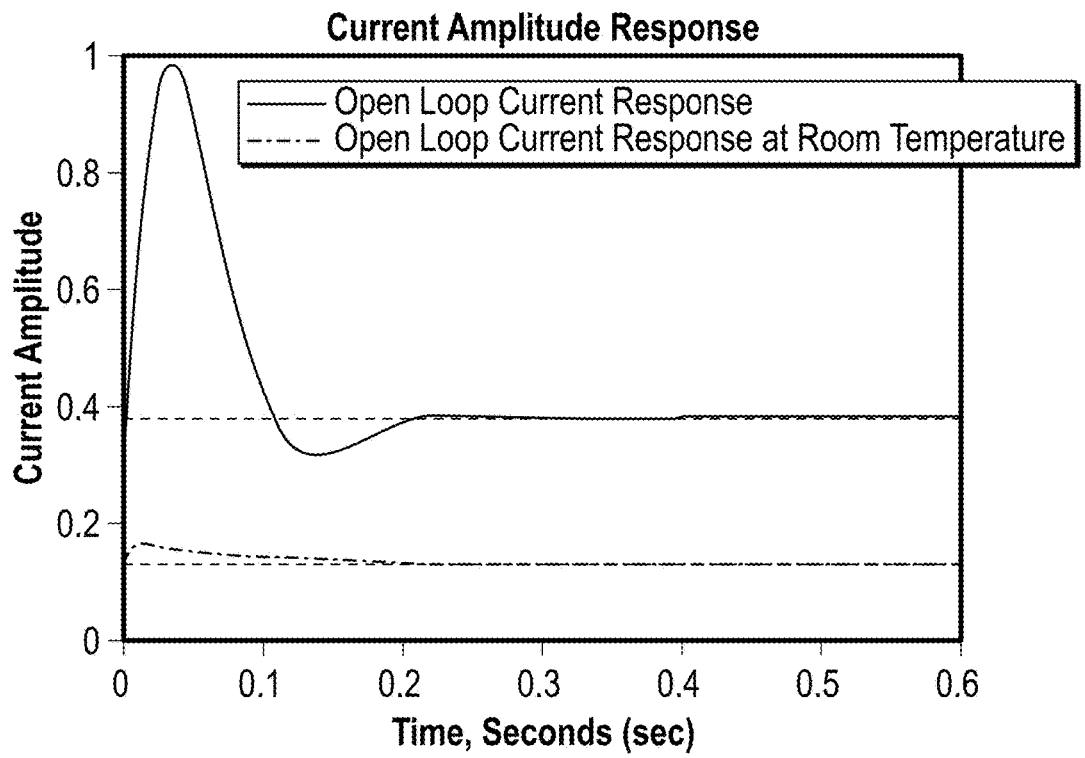
FIG. 4 is a plot illustrating the open-loop current amplitude response of a cryogenically cooled coil winding as compared to a coil at room temperature taking into account the effect of BEMF for a constant applied voltage of 1 V.

Additionally, when a coil is used in operation of a motor, relative motion of the magnet array with respect to the coils can induce voltages in the coils counter to the applied voltage, known as counter-electromotive force ("CEMF") or back-electromotive force (also referred to herein as "back-EMF" or "BEMF"). FIG. 3 illustrates the effect of BEMF on a coil winding of a motor. FIG. 4 illustrates the open-loop current amplitude response for a cryogenically cooled coil winding as compared to a coil at room temperature taking into account the effect of BEMF for a constant applied voltage of 1 V. As shown in FIG. 4, the current amplitude response of the cryogenically cooled coil demonstrates significant overshoot, peaking at nearly 1 A at about 0.03 second, before settling at about 0.4 A, while the coil at room temperature peaks at less than 0.2 A at about 0.01 second, before settling at about 0.15 A. Such increased overshoot and settling time of a cryogenically cooled motor coil can negatively impact the precision and accuracy of stage body motion in a precision system.

Figure 5:
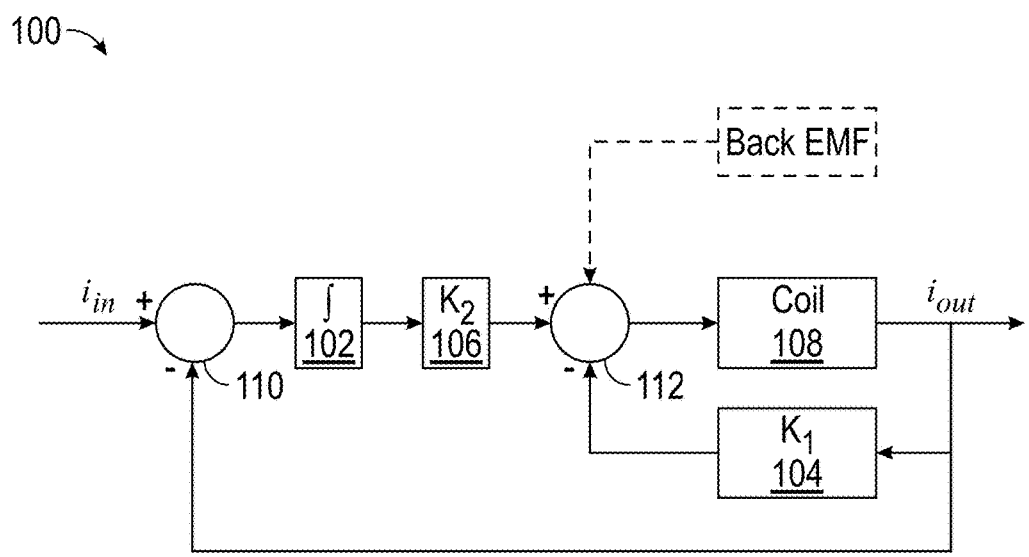
FIG. 5 is a schematic block diagram illustrating a representative embodiment of a control loop.

FIG. 5 is a schematic block diagram illustrating a representative embodiment of a control loop 100 including an integration block (module) 102, a first gain block (module) 104, a second gain block (module) 106, and a coil winding 108. The coil 108 can be, for example, a cryogenically cooled coil of a single phase motor, such as a brushed DC rotational motor, a voice coil motor, etc. The control loop 100 can be implemented, for example, as part of the control system 18 of FIG. 1, and can be operable to control the current output of the coil and account for BEMF generated in the coil winding. More specifically, the control loop 100 can be operable to control the response time, overshoot, and settling time of the current amplitude response of the coil 108.

Assuming a nominal resistance R and a nominal inductance L, the system can be modeled as a second order linear system, where the poles of the system can be adjusted by selecting first and second controller gain values $K_1$ and $K_2$ applied by the first and second gain blocks 104, 106, respectively. In certain embodiments, the poles of the system are located at the roots of the polynomial expression given in Equation 2 below.

$$\lambda^2 + 2\xi\omega_n + \omega_n^2 = 0 \qquad (2)$$

Where $\lambda$ is a variable representing the location of the pole of the closed-loop system, $\xi$ is a damping ratio, and $\omega_n$ is the undamped natural frequency of the system corresponding to the closed-loop poles of the system. $K_1$ and $K_2$ are given in the expressions below in Equations 3 and 4, respectively.

$$K_1 = 2\xi\omega_n L - R \qquad (3)$$

$$K_2 = L\omega_n^2 \qquad (4)$$

Returning to FIG. 5, a signal (first signal) indicative of the output current $i_{out}$ of the coil can be subtracted from a current command $i_{in}$ at a summing junction 110, and the current command $i_{in}$ can be integrated with respect to time at integration block 102 using, for example, a resistor-capacitor ("RC") network, or analog or digital computation.

At block 106, the second controller gain parameter $K_2$ can be applied to the current command $i_{in}$. In physical implementations of the control systems described herein, gain parameters such as $K_1$ and $K_2$ can be applied using, for example, any of various operational amplifiers, such as op-amp integrating amplifiers. Meanwhile, at block 104, the first controller gain parameter $K_1$ can be applied to the $i_{out}$ signal (second signal), which can be subtracted from the current command $i_{in}$ at summing junction 112. The resultant voltage input signal $V_{in}$ can be delivered to the coil 108. The effect of the BEMF of the coil 108 on the input voltage to the coil is also schematically represented at summing junction 112.

Figure 6:
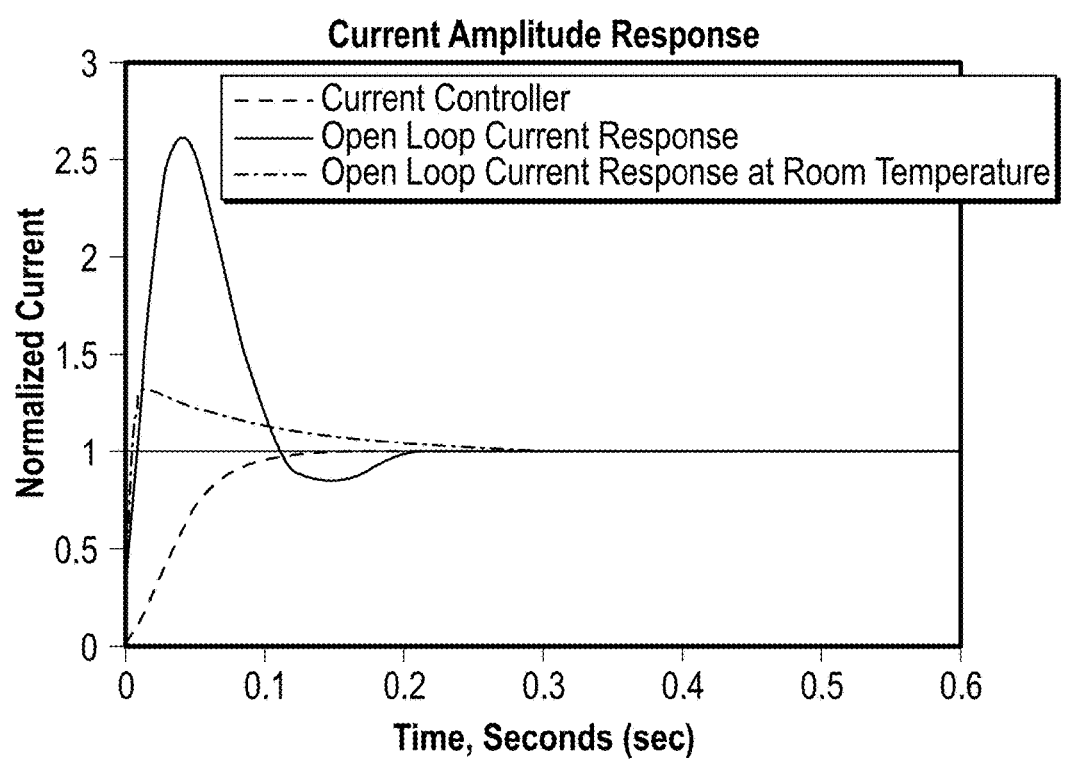
FIG. 6 is a plot of current amplitude response as compared to time for a cryogenically cooled coil including current control, a cryogenically cooled coil without current control, and a coil at room temperature.

By selecting $\xi \geq 1$, it is possible to reduce the current amplitude response time and reduce or eliminate overshoot, as illustrated below in FIG. 6, where $\xi=1$. By applying the control methodology of FIG. 5, overshoot can be eliminated in the closed-loop current amplitude response of the system, and the system achieves a steady-state output of 1 A at about 0.15 second. In contrast, the open loop response includes significant overshoot peaking at above 2.5 A, and the system does not settle at the 1 A steady-state output current condition until about 0.3 second.

Figure 7:
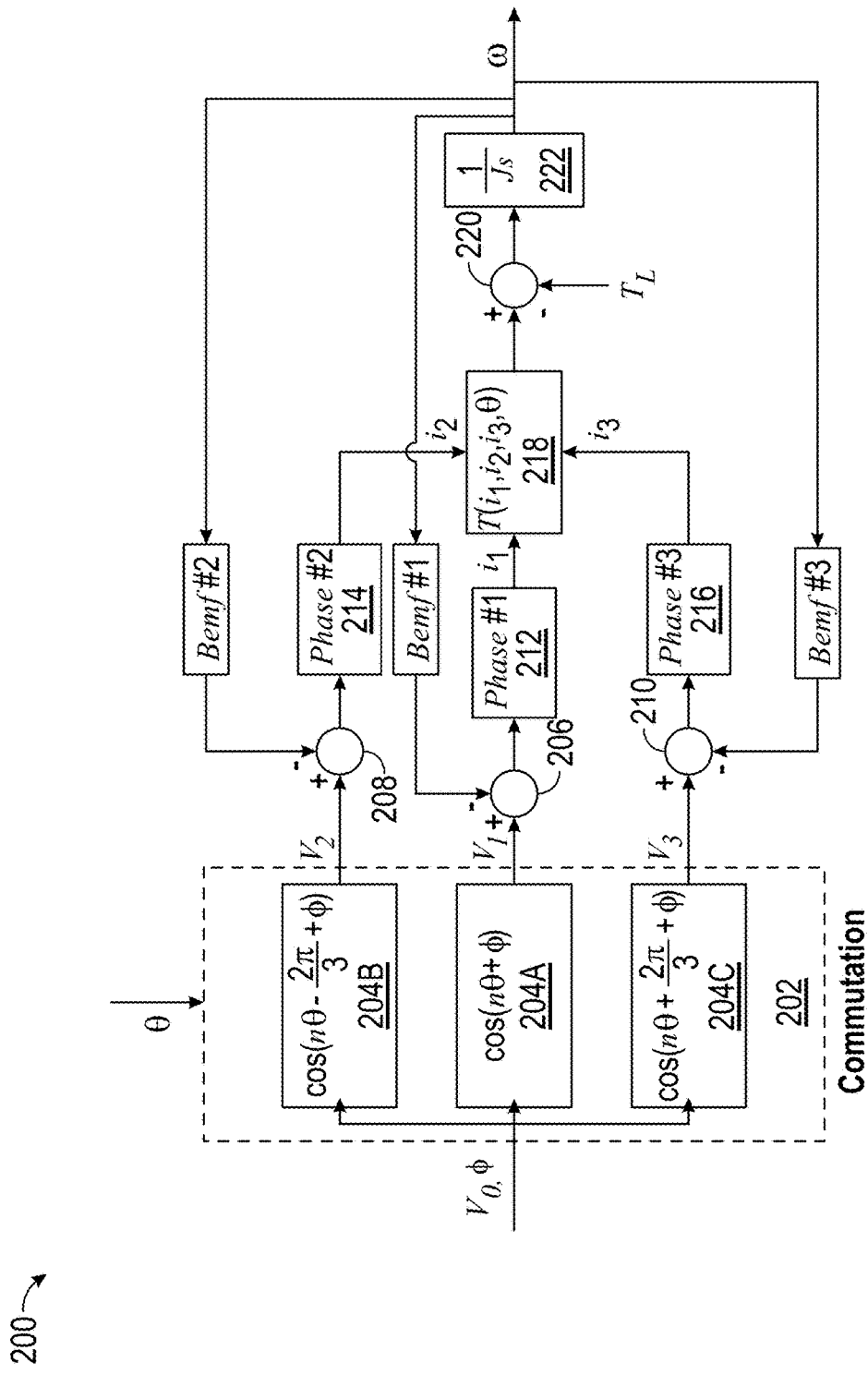
FIG. 7 is a schematic block diagram of a representative embodiment of a three-phase motor system.

The above control methodology can be extended to three-phase alternating current machines that are cryogenically cooled including, for example, three-phase linear brushless motors, brushless planar motors, or rotary brushless motors. FIG. 7 illustrates a schematic block diagram of a representative embodiment of a three-phase motor system 200. An input voltage amplitude command $V_0$ and a phase shift command $\phi$ can be inputted into a commutation block or module 202, where $\phi$ represents the phase shift angle (e.g., in radians) and $\theta$ represents the displacement (e.g., in radians). Three-phase commutation is applied by phase commutation blocks 204A-204C, where n represents the number of pole pairs corresponding to the permanent magnet configuration. The resultant phase voltages $v_1$, $v_2$, and $v_3$ are outputted, and the effect of BEMF on each phase is schematically indicated at the respective summing junctions 206, 208, 210. Phase voltages $v_1$, $v_2$, and $v_3$ are then inputted to blocks 212, 214, 216 representing the coil windings corresponding to the three phases of the motor. The blocks 212, 214, 216 can contain transfer functions representing the respective coil windings including resistance and inductance representations, and can output phase currents $i_1$, $i_2$, and $i_3$ corresponding to the respective coil windings.

The phase currents $i_1$, $i_2$, and $i_3$ can be inputted to block 218 including a transfer function $T(i_1, i_2, i_3, \theta)$ representing the nominal force or torque produced by the motor. At summing junction 220, the force or torque of the load $T_L$ on the motor can be subtracted from the nominal torque T, and block 222 can apply a transfer function 1/Js to the resultant net torque to obtain the velocity output $\omega$ of the mass or inertia J driven by the motor.

Figure 8:
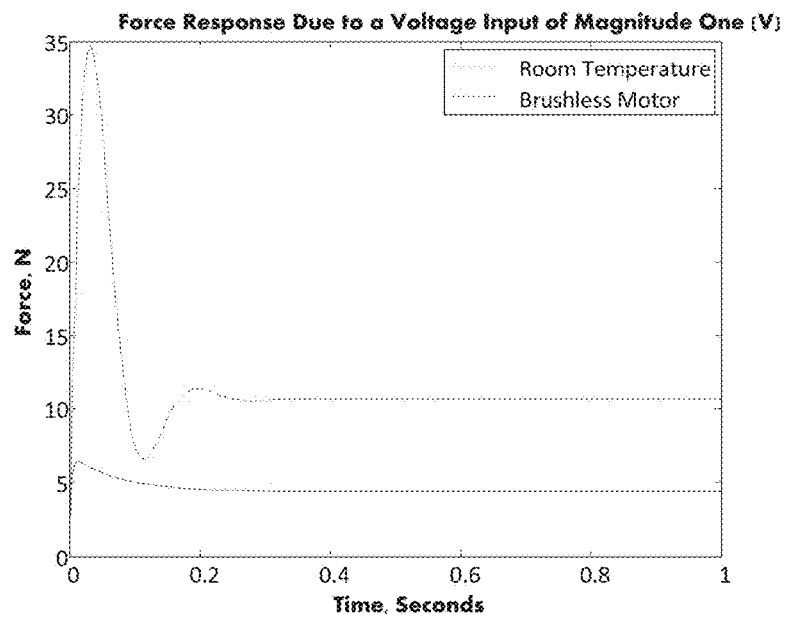
FIG. 8 is a plot illustrating the force output of a three-phase brushless motor at cryogenic temperatures as compared to room temperature for a sinusoidal voltage input of amplitude 1 V.

The force output of a three-phase brushless motor at cryogenic temperatures versus room temperature is illustrated in FIG. 8 for a sinusoidal voltage input of amplitude 1 V. Due to the lower coil resistance R, the force output of the cryogenically cooled motor peaks at nearly 35 N at about 0.05 seconds, before settling at about 11 N after about 0.35 seconds, while the force output of a similar motor at room temperature peaks at about 6 N shortly after start and settles at about 5 N after about 0.3 to 0.4 seconds. Thus, it is desirable to control the three-phase currents of a cryogenically cooled AC motor to reduce overshoot in the output force, reduce the settling time, and account for the sinusoidally varying disturbance on the system due to the BEMF in the motor windings.

In certain embodiments, the three-phase systems can be modeled in the direct-axis, quadrature-axis, and zero-sequence-axis reference frame (referred to herein as the "dq0 reference frame") to simplify analysis of three-phase quantities. For example, reference quantities or commands, such as current commands, can be provided to the control system 18 (see FIG. 1) as direct-axis or quadrature-axis quantities, and three-phase quantities such as current, voltage, phase, etc., of the motor can be transformed into the dq0 reference frame by a one or more mathematical operations, referred to collectively herein as "dq0 transformation," and provided to the control system. This allows sinusoidal three-phase quantities such as current, BEMF, etc., to be treated as direct current ("DC") quantities for purposes of analysis. Output parameters provided by the control system, such as input voltages to the motor, can be transformed into the standard reference frame by an inverse dq0 transformation. Although the present example proceeds with respect to an alternating current system having three phases, it should be appreciated that the control principles described herein can be applicable to a system having any number of phases.

Figure 9:
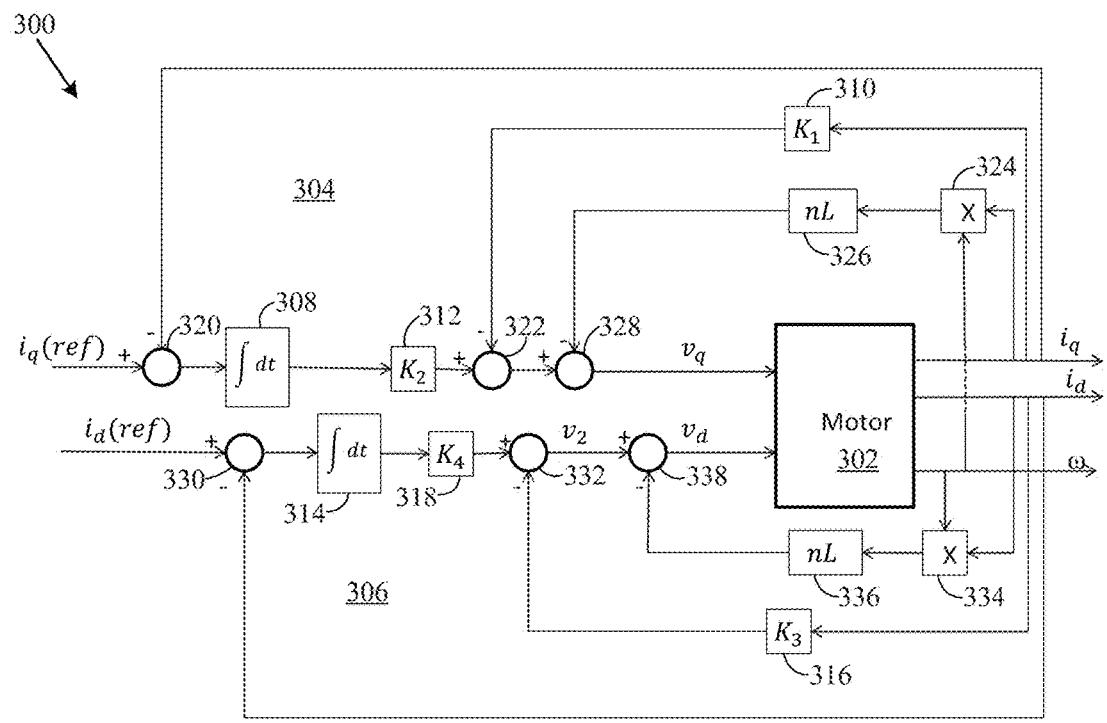
FIG. 9 is a schematic block diagram illustrating a representative embodiment of a control loop adapted to control the current output of a cryogenically cooled three-phase brushless motor.

FIG. 9 is a schematic block diagram illustrating a representative embodiment of a control loop 300 adapted to control the current output of a cryogenically cooled three-phase brushless motor 302 and account for BEMF in the coil windings in the dq0 reference frame. The control loop 300 can include two primary loops, namely a quadrature-axis loop 304 and a direct-axis loop 306. The quadrature-axis loop 304 can include an integration block (module) 308, and first and second controller gain blocks (modules) 310, 312 to apply controller gains $K_1$ and $K_2$ to a quadrature-axis current reference or current command $i_q(\text{ref})$. The direct-axis loop 306 can likewise include an integration block 314, and third and fourth controller gain blocks (modules) 316, 318 to apply controller gains $K_3$ and $K_4$ to a direct-axis current reference or current command $i_d(\text{ref})$.

The control system illustrated in FIG. 9 can be modeled as two independent second order linear systems. The location of the four poles of the two second order systems and, hence, the stability margin of the system, can be adjusted by choosing the values of the controller gains $K_1$, $K_2$, $K_3$, and $K_4$. The poles of the system are located at the roots of the polynomial expressions given below in Equations 5 and 6.

$$\lambda^2 + 2\xi_q \omega_{n_q} \lambda + \omega_{n_q}^2 = 0 \quad (5)$$

$$\lambda^2 + 2\xi_d \omega_{n_d} \lambda + \omega_{n_d}^2 = 0 \quad (6)$$

Where $\lambda$ is a variable representing the location of the poles of the system, $\xi_q$ represents the damping ratio of the system dynamics in the quadrature axis, $\xi_d$ represents the damping ratio of the system in the direct axis, $\omega$ is the velocity (e.g., in radians per second), $\omega_{n_q}$ is the undamped natural frequency of the system in the quadrature axis, and $\omega_{n_d}$ is the undamped natural frequency of the system in the direct axis. The controller gains $K_1$, $K_2$, $K_3$, and $K_4$ can be modeled according to the following expressions in Equations 7, 8, 9, and 10, respectively.

$$K_1 = 2\xi_q \omega_{n_q} L - R \quad (7)$$

$$K_2 = L\omega_{n_q}^2 \quad (8)$$

$$K_3 = 2\xi_d \omega_{n_d} L - R \quad (9)$$

$$K_4 = L\omega_{n_d}^2 \quad (10)$$

Returning to FIG. 9, a signal (first signal) indicative of the quadrature-axis current output $i_q$ of the motor 302 can be subtracted from the quadrature-axis current command $i_q(\text{ref})$ at a summing junction 320 (e.g., a first summing junction). The quadrature-axis current command $i_q(\text{ref})$ can then be integrated with respect to time at the integration block 308, and the controller gain $K_2$ can be applied at block 312. Meanwhile, controller gain $K_1$ can be applied to the signal (second signal) indicative of the quadrature-axis current output $i_q$ of the motor at block 310, which can then be subtracted from the quadrature-axis current command $i_q(\text{ref})$ at a summing junction 322 (e.g., a second summing junction). Non-linear components of the model can be accounted for in the quadrature-axis loop 304 by block 324, where the velocity $\omega$ of the motor 302 can be combined with or multiplied by the quadrature axis current $i_q$ at block 324, and the resultant can be multiplied by nL at block 326. The resultant $nL\omega i_q$ is then subtracted from the quadrature-axis current command $i_q(\text{ref})$ at summing junction 328 (e.g., a third summing junction). A final quadrature-axis input voltage $v_q$ can then be supplied to the motor 302.

Turning to the direct-axis loop 306, a signal (first signal) indicative of the direct-axis current output $i_d$ of the motor 302 can be subtracted from the direct-axis current command $i_d(\text{ref})$ at a summing junction 330. The direct axis current command $i_d(\text{ref})$ can then be integrated with respect to time at the integration block 314, and the controller gain $K_4$ can be applied at block 318. Meanwhile, controller gain $K_3$ can be applied to the signal (second signal) indicative of the direct-axis current output $i_d$ of the motor at block 316, which can be subtracted from the direct-axis current command $i_d(\text{ref})$ at a summing junction 332. Non-linear components of the model can be accounted for in the direct-axis loop 306 by blocks 334 and 336, as explained above with respect to the quadrature-axis loop 304, and combined with the direct-axis current command $i_d(\text{ref})$ at summing junction 338. A final direct-axis input voltage $v_d$ can then be supplied to the motor 302.

Figure 10:
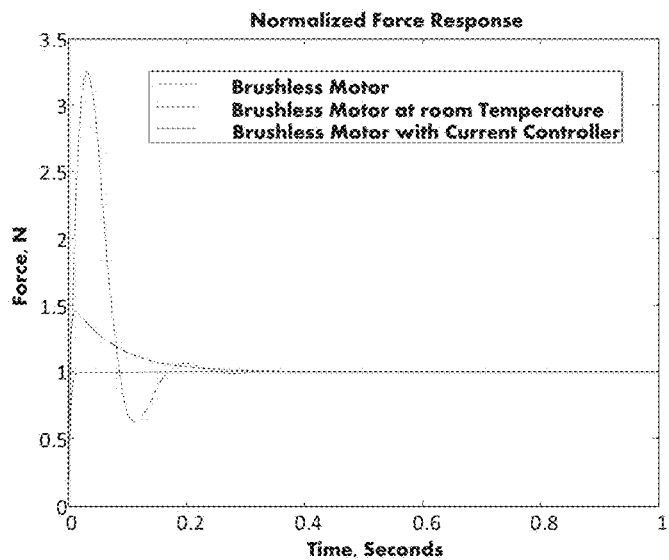
FIG. 10 is a plot illustrating the force output of a cryogenically cooled brushless AC motor employing the current control scheme of FIG. 9.

By selecting $\xi_q \geq 1$ and $\xi_d \geq 1$, overshoot in the current amplitude response (and thereby the force and/or torque response) of the coils of the motor can be reduced or eliminated when the motor is cooled to cryogenic temperatures. In certain embodiments, the time required to achieve a selected steady-state output can also be reduced. FIG. 10 illustrates the force output of a cryogenically cooled brushless AC motor employing the current control scheme of FIG. 9 juxtaposed with the current responses of a cryogenically cooled motor with no current control and a brushless AC motor at room temperature. As shown in FIG. 10, the cryogenically cooled motor with no current control displays a peak force value of about 3.25 N at about 0.03 second, and does not settle at its steady-state output of 1 N until nearly 0.4 second. The force output of the brushless motor at room temperature peaks at just below 1.5 N at 0.01 seconds, and gradually settles to a steady-state output of 1 N at about 0.4 second. Meanwhile, the cryogenically cooled motor employing the current control methods described herein with $\xi_q = \xi_d = 1$ achieves the steady-state condition of 1 N at about 0.01 second and displays no appreciable overshoot. In certain embodiments, the control system described herein can also reduce or eliminate steady-state error relative to the reference inputs (e.g., $i_q(\text{ref})$, $i_q(\text{ref})$, or other inputs such as constant voltages inputs).

Figure 11:
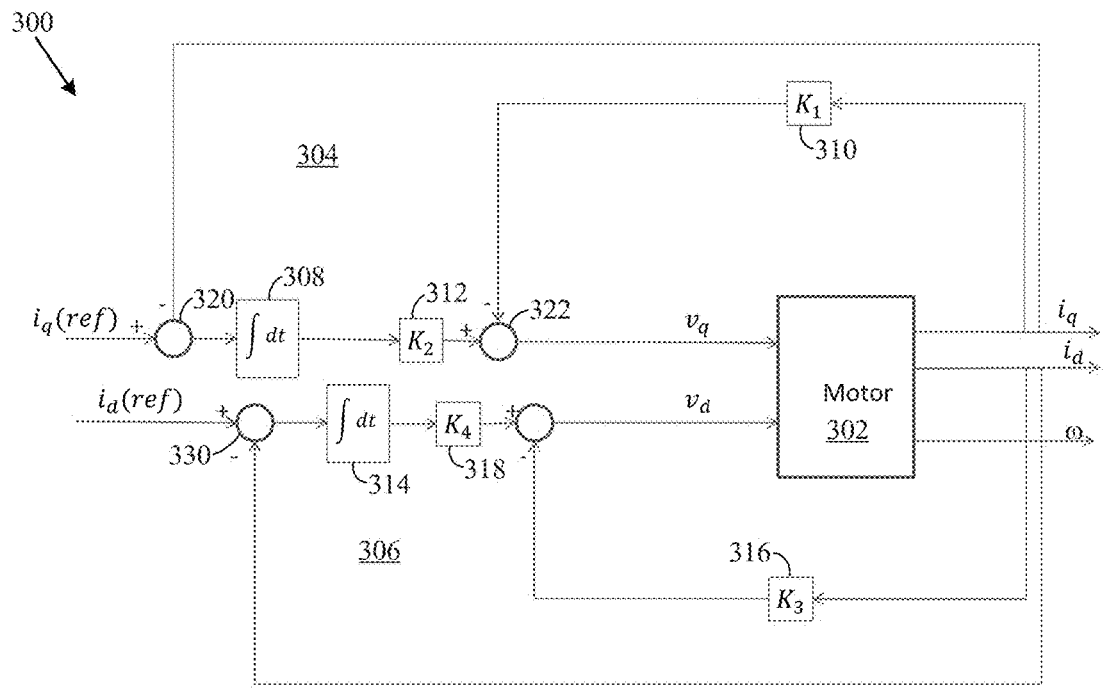
FIG. 11 is a schematic block diagram illustrating a modified version of the control system of FIG. 9 in which the non-linear terms are removed from the quadrature-axis and direct-axis loops.
Figure 12:
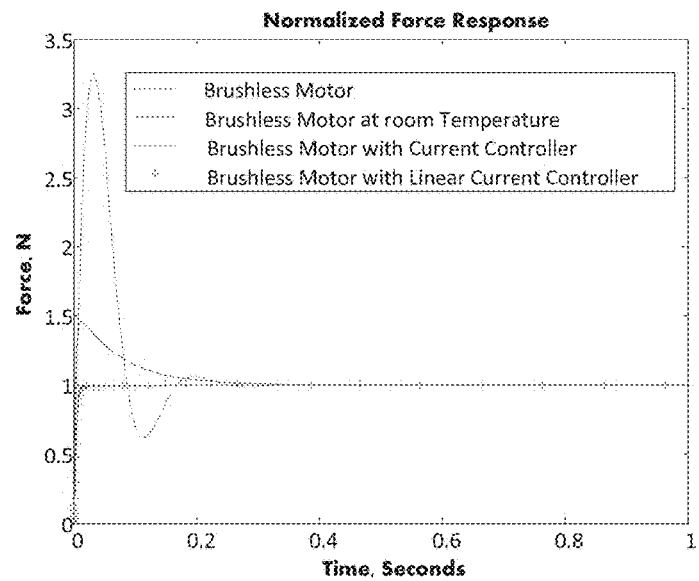
FIG. 12 is a plot illustrating the force responses of motors employing the control schemes of FIGS. 9 and 11 as compared to the force response of a motor without current control and a motor at room temperature.

FIG. 11 illustrates a simplified version of the control system of FIG. 9 in which the non-linear terms X and nL are removed from the quadrature-axis and direct-axis loops 304, 306. A plot of the force response of a cryogenically cooled motor employing the control scheme of FIG. 9 (including the non-linear terms of the model) and a motor employing the control scheme of FIG. 11 (neglecting the non-linear terms of the model) is presented in FIG. 12, along with the force output of a cooled motor with no current control and the force output of a motor at room temperature. As illustrated in FIG. 12, the force responses of the motors employing the control schemes of FIGS. 9 and 11 do not display significant variation, indicating that the non-linear terms of the model do not significantly impact performance of the motor.

Figure 13:
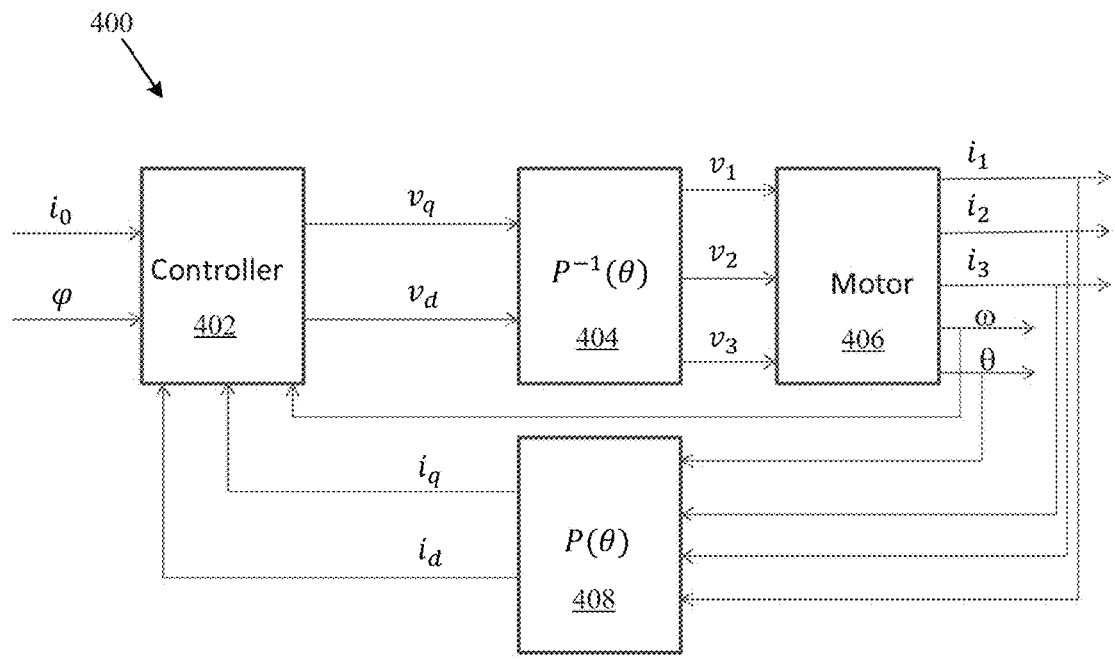
FIG. 13 is a schematic block diagram illustrating the feedback control loops described herein interacting with a motor system via transformation modules.

FIG. 13 is a schematic block diagram 400 illustrating how any of the feedback control loops described herein that are implemented in the dq0 reference frame can interact with a motor system. A current command $i_0$ and phase angle ϕ can be inputted to a controller block 402, which can be analogous to, for example, the control system 18 of FIG. 1, and can implement any of the control methodologies described herein. The controller block 402 can output a quadrature-axis voltage $v_q$ and a direct-axis voltage $v_d$ to an inverse dq0 transformation (or inverse Park's transformation) block 404, which can transform the direct- and quadrature-axis variables from the dq0 reference frame back to a standard three-phase reference frame. The resultant three-phase voltages $v_1$, $v_2$, and $v_3$ can then be inputted to a cryogenically cooled motor 406, which can generate currents $i_1$, $i_2$ and $i_3$ in the motor windings, causing motion of, for example, a stage body. The currents $i_1$, $i_2$ and $i_3$, along with the velocity ω and the displacement θ can be fed back to a dq0 transformation (or Park's transformation) block 408, which can transform the three-phase variables to the dq0 reference frame, and output signals indicative of the output current of the motor 406 as quadrature-axis current $i_q$ and direct-axis current $i_d$, back to the controller block 402.

Figure 14:
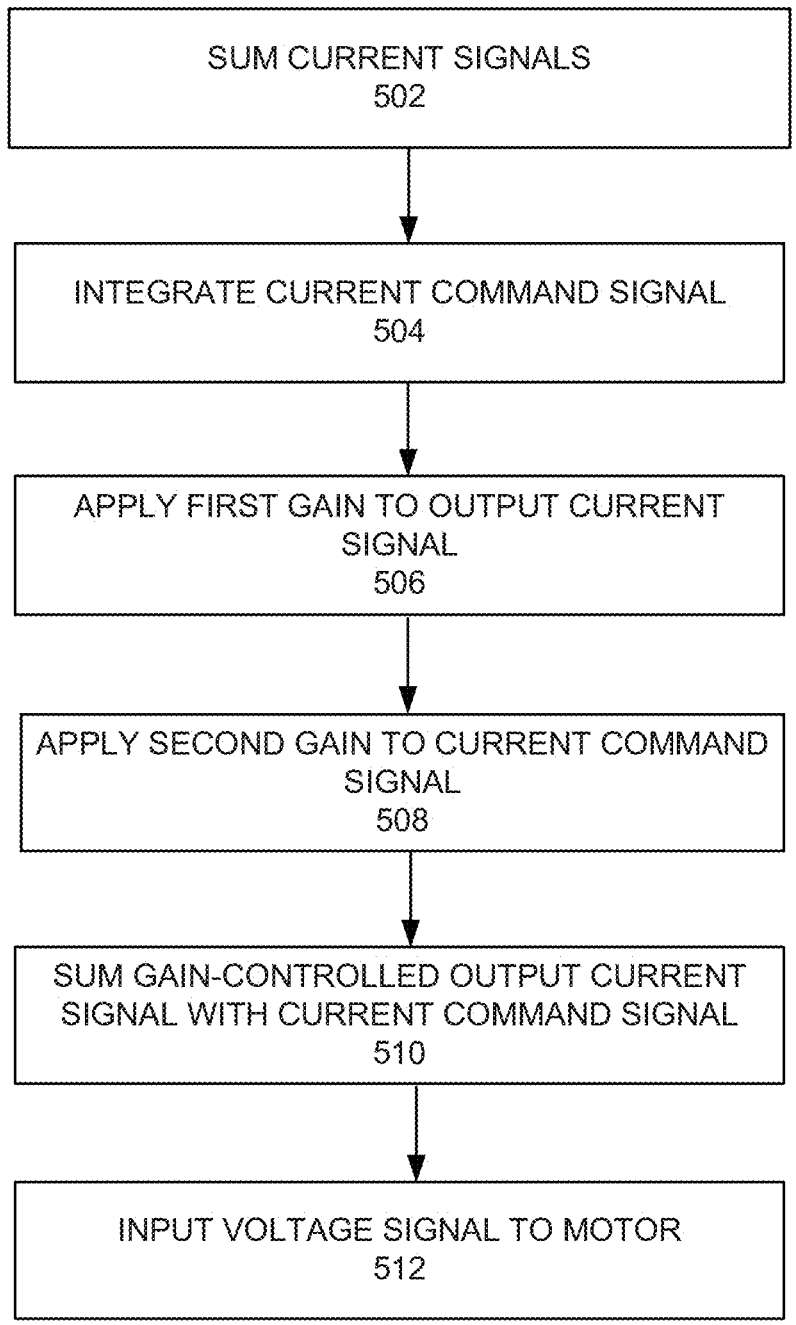
FIG. 14 is a process flow diagram illustrating a representative method of controlling the force and/or current amplitude response of a cryogenically cooled motor coil.

FIG. 14 is a block diagram illustrating a representative method of controlling the force and/or current amplitude response of a cryogenically cooled motor coil. At block 502, a signal indicative of an output current of a motor can be summed with a current command signal.

At block 504, the current command signal can be integrated with respect to time.

At block 506, a first controller gain can be applied to the signal indicative of the output current of the motor to obtain a gain-controlled signal indicative of the output current of the motor.

At block 508, a second controller gain can be applied to the current command signal to obtain a gain-controlled current command signal.

At block 510, the gain-controlled signal indicative of the output current of the motor can be summed with the gain-controlled current command signal to obtain a voltage signal.

At block 512, the voltage signal can be inputted to the motor. Therefore, currents and/or forces generated by the cryogenically cooled motor can be controlled as desired.

Second Representative Embodiment

Referring again to FIG. 1, utilities such as electricity, vacuum, water, etc., can be supplied to the stage body 14 by one or more cables and/or hoses (not shown). Such cables and hoses impart disturbances on the stage body, negatively impacting the precision and accuracy of stage motion and potentially resulting in following error in the pattern(s) produced on the wafer.

Figure 15:
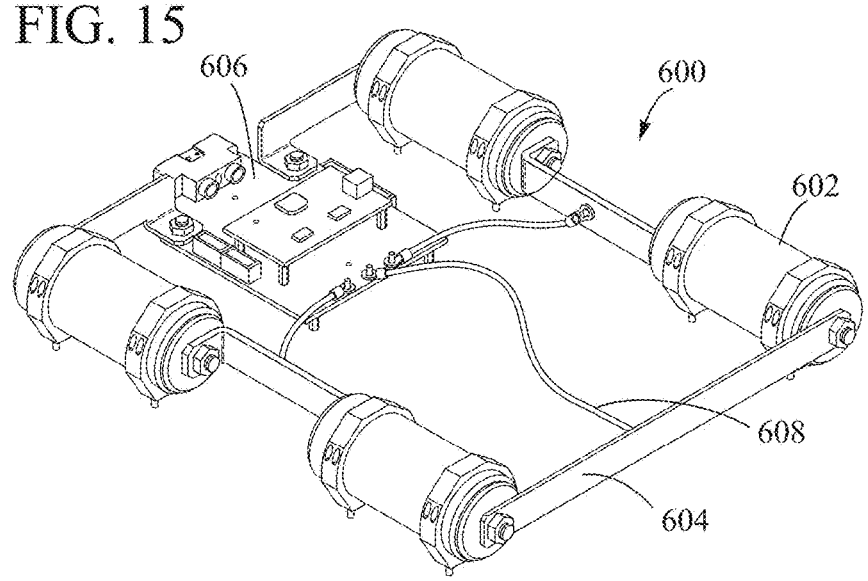
FIG. 15 is a perspective view illustrating a representative embodiment of a capacitor network.
Figure 16:
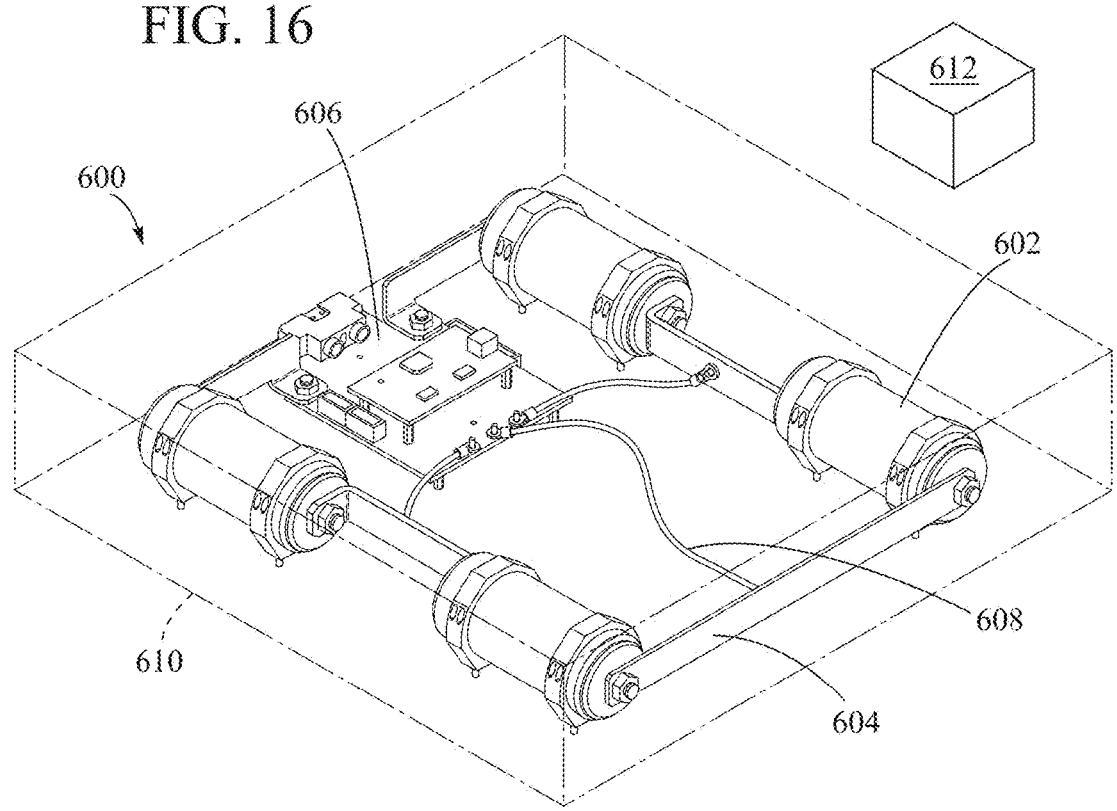
FIG. 16 is another perspective view of the capacitor network of FIG. 15 schematically illustrated in a stage body.

FIG. 15 illustrates a representative embodiment of a capacitor network 600 including capacitors 602 electrically coupled to one another by conductive members 604, and a printed circuit board (PCB) 606. The conductive members 604 can also be electrically connected to the PCB 606 directly, or by conductive leads or wires 608. In the illustrated embodiment, the capacitor network includes four capacitors 602 in a rectangular arrangement and electrically connected in series. However, it should be understood that the capacitor network can include any suitable number of capacitors arranged in any suitable shape, and may be connected in series or in parallel. In certain embodiments, the capacitor network can be situated on or inside a stage body 610, as shown in FIG. 16.

In certain embodiments, one or more of the capacitors 602 can be supercapacitors. As used herein, the term "supercapacitor" refers to a capacitor having a capacitance value of about 1,000 F or greater. By properly selecting the number, capacitance value, wiring arrangement, voltage, etc., of the supercapacitors, it is possible to supply at least the electrical loads on the stage body for a selected period of time. The electrical loads of the various electronic components of the stage body are collectively termed herein "stage electrical loads," and can include, for example, motors, such as voice coil motors, pumps, heaters, electronics, etc. The amount of time that the capacitor network can supply the electrical needs of the stage body is necessarily dependent upon the charge capacity of the capacitor network and the power requirements of the stage electrical loads.

In the embodiment illustrated in FIG. 15, the capacitors 602 can be supercapacitors having a capacitance of, for example, 3,000 F, and a voltage across the terminals of 2.5 V. Thus, when the supercapacitors are connected in series, the capacitor network can have a total capacitance of 750 F and a total voltage of 10 V.

Figure 17:
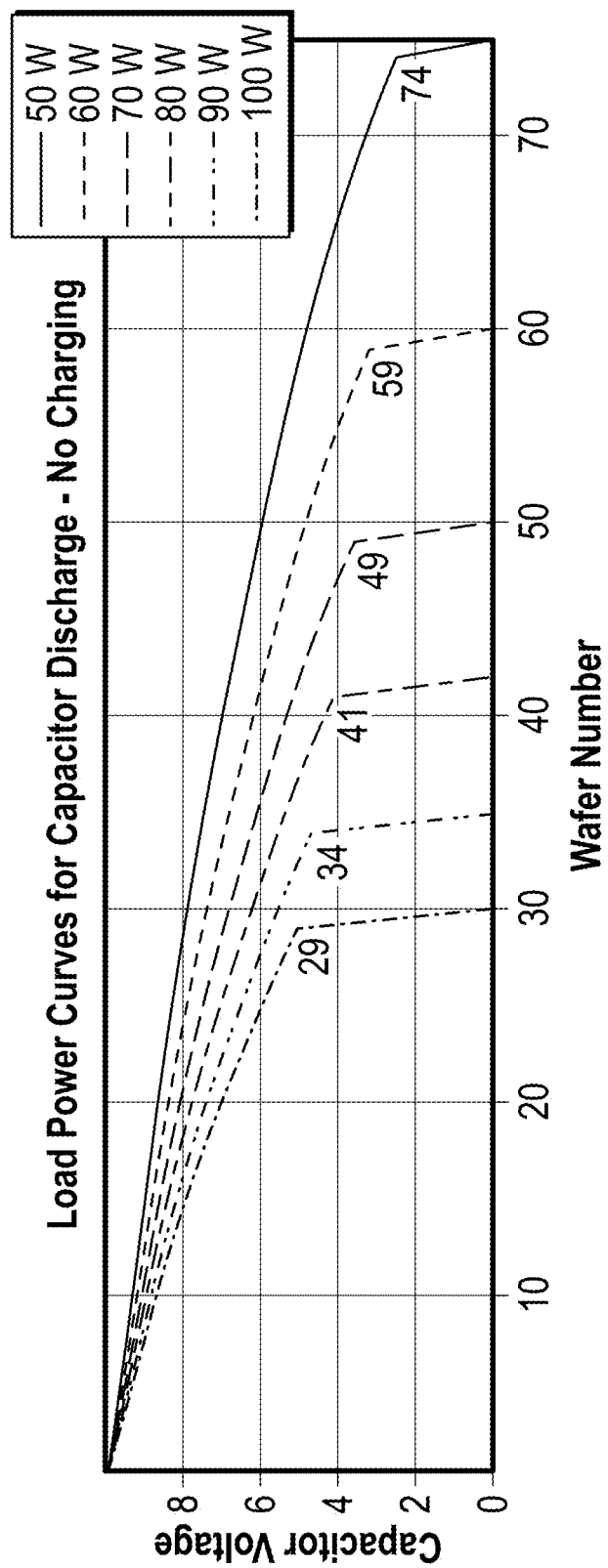
FIG. 17 is a plot illustrating capacitor network voltage versus number of wafers processed for various stage electrical loads.

FIG. 17 is a plot illustrating capacitor network voltage versus number of wafers processed 15 for stage electrical loads of 50 W, 60 W, 70 W, 80 W, 90 W, and 100 W. In the example of FIG. 17, the capacitor network is fully charged before the first wafer is processed, and does not receive any additional charge after wafer processing begins. In this scenario, the capacitor network provides enough electricity to power the electrical loads of the stage body long enough to process 74 wafers if the stage electrical load is 50 W, and 29 wafers if the stage electrical load is 100 W, before the capacitor network is fully discharged and must be recharged to continue operation.

In certain embodiments, it is possible to charge the capacitor network periodically during wafer processing, such as during wafer exchange. In the embodiment of FIG. 16, the stage body 610 can be configured to dock, or otherwise make electrical contact with, a charging element, such as a docking station 612. This can allow electrical power to be transferred from the docking station 612 to the capacitor network on the stage body 610 while electrical contact is maintained, referred to herein as a "charging period." Conversely, the time period during which the capacitor network is disconnected from the charging element and is supplying the stage electrical loads is referred to herein as the "discharge period." Because wafer exchange occurs rapidly, the time available to charge the capacitor network can be relatively short. For example, the time available to charge the capacitor network can be from about 0.1 second to about 2 seconds. In some embodiments, the time available to charge the capacitor network can be less than 1 second, such as about 0.8 second.

Figure 18:
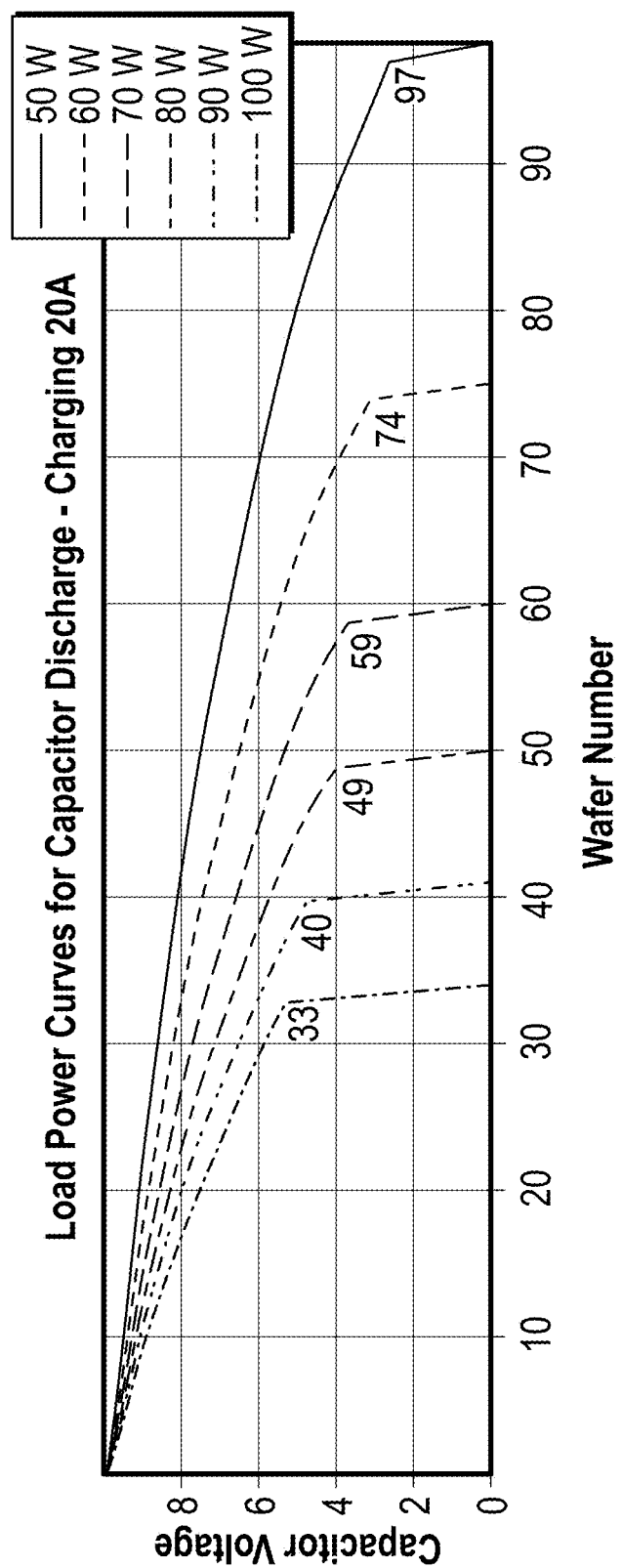
FIGS. 18 and 19 are plots illustrating capacitor network voltage as compared to the number of wafers processed for various stage electrical loads when the capacitor network is periodically recharged at various current values.

Thus, the length of time for which the capacitor network can supply the stage electrical loads and, thereby, the number of wafers that can be processed, can be determined at least in part by the energy transferable to the capacitor network during charge periods and the energy dissipated during discharge periods. FIG. 18 illustrates plots of capacitor network voltage versus the number of wafers processed for loads of 50 W to 100 W when the capacitor network is periodically charged every 9.5 seconds with a current of 20 A for a period of 0.8 second (e.g., the stage makes electrical contact with the charging element every 9.5 seconds for a period of 0.8 second). As shown in FIG. 18, this periodic charging allows the stage to process 97 wafers at a stage electrical load of 50 W, and 33 wafers at a stage electrical load of 100 W before the voltage of the capacitor network falls below an operational minimum.

Figure 19:
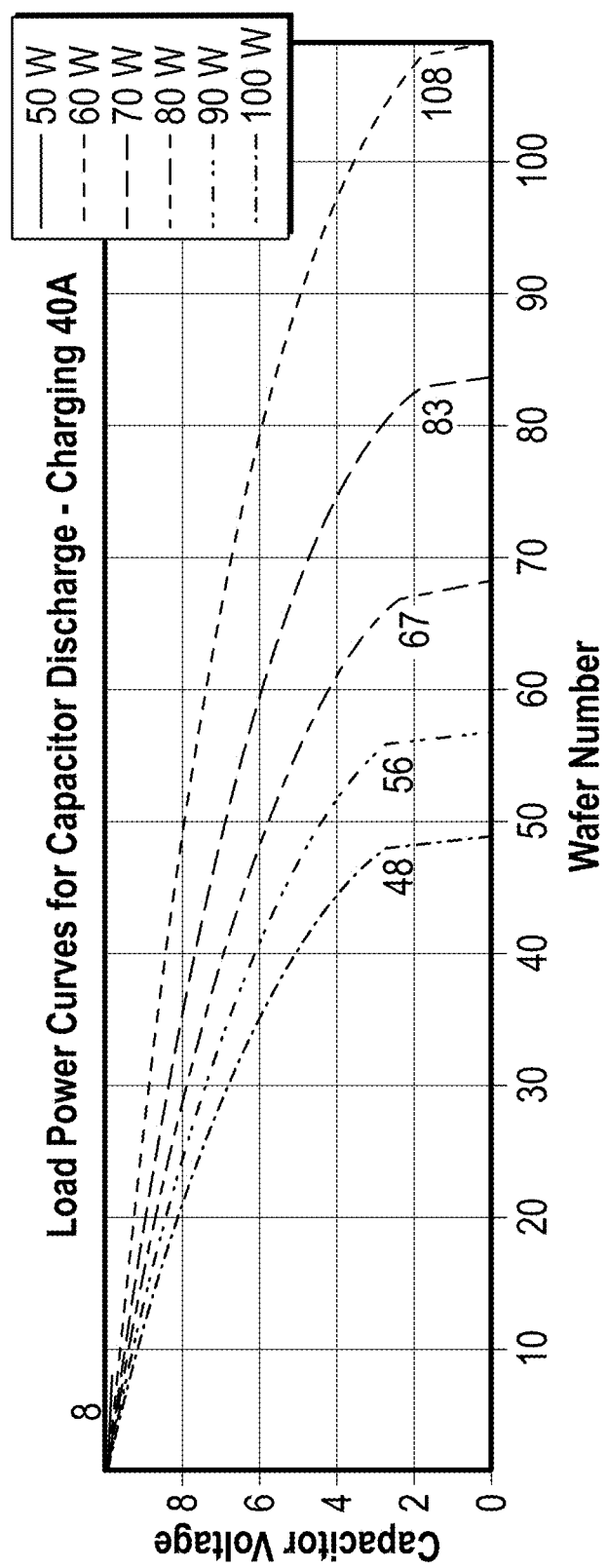

By selecting the proper current value, it is possible to replenish all of the energy dissipated during the discharge period during the charging period. FIG. 19 illustrates capacitor network voltage versus the number of wafers processed when the capacitor network is periodically charged with a current of 40 A (e.g., for 0.8 second at 9.5 second intervals). In this case, it is possible to process 108 wafers at a stage electrical load of 60 W, and 48 wafers at a stage electrical load of 100 W, before the capacitor network is fully discharged.

For the illustrated embodiment, it is possible to meet the stage electrical loads indefinitely at a load of 50 W if the capacitor network is periodically recharged with a current of 40 A for 0.8 second after processing 8 wafers (the time required to process a wafer can vary from system to system, but can be, for example, about 10 seconds in some embodiments). It is possible to meet the stage electrical loads indefinitely at any power level if sufficient charging current is provided. For example, the stage electrical loads can be met indefinitely at a power requirement of 100 W by increasing the charging current to 80 A in the present embodiment. Indefinite operation of the stage may also be achieved by charging the capacitor network at lower currents for longer periods of time. For example, charging the capacitor network during events such as Front Opening Unified Pod (FOUP) exchange or other events in the lithography process, can provide an opportunity to charge the capacitor network for longer periods of time.

Figure 20:
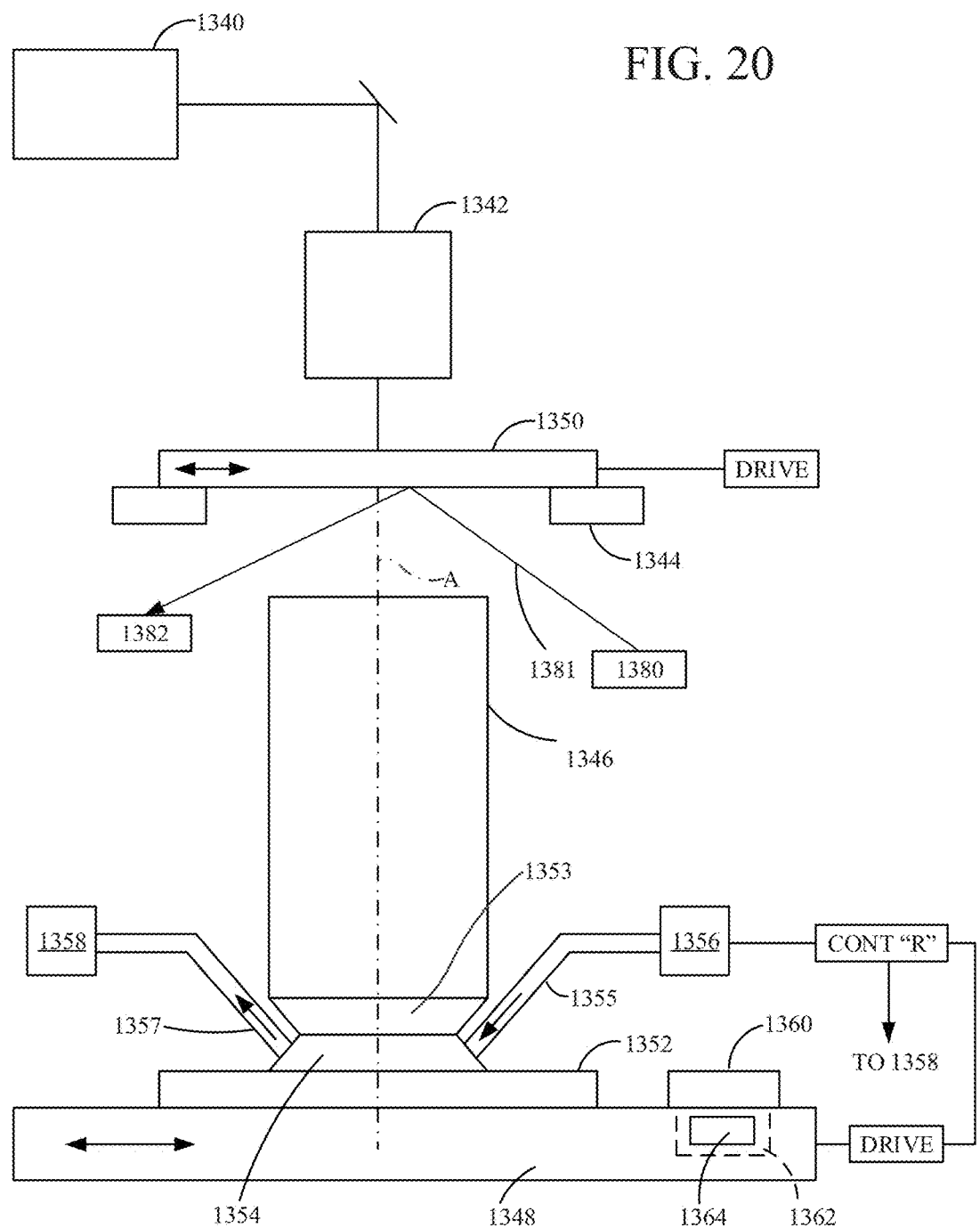
FIG. 20 is a schematic diagram of an immersion microlithography system, which is a first example of a precision system including a stage assembly as described herein.

The methods and apparatus disclosed above can be used in conjunction with various precision systems such as various types of lithography systems and other wafer processing systems and methods. Turning to FIG. 20, certain features of an immersion lithography system (an exemplary precision system) are shown, namely, a light source 1340, an illumination-optical system 1342, a reticle stage 1344, a projection-optical system 1346, and a wafer (substrate) stage 1348, all arranged along an optical axis A. The light source 1340 is configured to produce a pulsed beam of illumination light, such as DUV light of 248 nm as produced by a KrF excimer laser, DUV light of 193 nm as produced by an ArF excimer laser, or DUV light of 157 nm as produced by an $F_2$ excimer laser. The illumination-optical system 1342 includes an optical integrator and at least one lens that conditions and shapes the illumination beam for illumination of a specified region on a patterned reticle 1350 mounted to the reticle stage 1344. The pattern as defined on the reticle 1350 corresponds to the pattern to be transferred lithographically to a wafer 1352 that is held on the wafer stage 1348. Lithographic transfer in this system is by projection of an aerial image of the pattern from the reticle 1350 to the wafer 1352 using the projection-optical system 1346. The projection-optical system 1346 typically comprises many individual optical elements (not detailed) that project the image at a specified demagnification ratio (e.g., 1/4 or 1/5) on the wafer 1352. So as to be imprintable, the wafer surface is coated with a layer of a suitable exposure-sensitive material termed a "resist."

The reticle stage 1344 is configured to move the reticle 1350 in the X-direction, Y-direction, and rotationally about the Z-axis. To such end, the reticle stage is equipped with one or more linear or planar motors having cooled coils as described herein. The two-dimensional position and orientation of the reticle 1350 on the reticle stage 1344 are detected by a position sensor (e.g., a laser interferometer or a precision encoder) in real time, and positioning of the reticle 1350 is effected by a main control unit on the basis of the detection thus made.

The wafer 1352 is held by a wafer holder ("chuck," not shown) on the wafer stage 1348. The wafer stage 1348 includes a mechanism (not shown) for controlling and adjusting, as required, the focusing position (along the Z-axis) and the tilting angle of the wafer 1352. The wafer stage 1348 also includes electromagnetic actuators (e.g., linear motors or a planar motor, or both) for moving the wafer in the X-Y plane substantially parallel to the image-formation surface of the projection-optical system 1346. These actuators desirably comprise linear motors, one more planar motors, or both. In some embodiments, the actuators can directly control all six rigid body degrees of freedom of the wafer stage 1348.

The wafer stage 1348 also includes mechanisms for adjusting the tilting angle of the wafer 1352 by an auto-focusing and auto-leveling method (e.g., in systems where the actuators position and move the wafer stage 1348 in the X-Y plane). Thus, the wafer stage serves to align the wafer surface with the image surface of the projection-optical system. The two-dimensional position and orientation of the wafer are monitored in real time by another position sensor, such as a laser interferometer or a precision encoder. Control data based on the results of this monitoring are transmitted from the main control unit to a drive circuits for driving the wafer stage. During exposure, the light passing through the projection-optical system is made to move in a sequential manner from one location to another on the wafer, according to the pattern on the reticle in a step-and-repeat or step-and-scan manner.

The projection-optical system 1346 normally comprises many lens elements that work cooperatively to form the exposure image on the resist-coated surface of the wafer 1352. For convenience, the most distal optical element (i.e., closest to the wafer surface) is an objective lens 1353. Since the depicted system is an immersion lithography system, it includes an immersion liquid 1354 situated between the objective lens 1353 and the surface of the wafer 1352. As discussed above, the immersion liquid 1354 is of a specified type. The immersion liquid is present at least while the pattern image of the reticle is being exposed onto the wafer.

The immersion liquid 1354 is provided from a liquid-supply unit 1356 that may comprise a tank, a pump, and a temperature regulator (not individually shown). The liquid 1354 is gently discharged by a nozzle mechanism 1355 into the gap between the objective lens 1353 and the wafer surface. A liquid-recovery system 1358 includes a recovery nozzle 1357 that removes liquid from the gap as the supply 1356 provides fresh liquid 1354. As a result, a substantially constant volume of continuously replaced immersion liquid 1354 is provided between the objective lens 1353 and the wafer surface. The temperature of the liquid is regulated to be approximately the same as the temperature inside the chamber in which the lithography system itself is disposed.

Also shown is a sensor window 1360 extending across a recess 1362, defined in the wafer stage 1348, in which a sensor 1364 is located. Thus, the window 1360 sequesters the sensor 1364 in the recess 1362. Movement of the wafer stage 1348 so as to place the window 1360 beneath the objective lens 1353, with continuous replacement of the immersion fluid 1354, allows a beam passing through the projection-optical system 1346 to transmit through the immersion fluid and the window 1360 to the sensor 1364.

An interrogation beam source 1380 is situated to direct an interrogation optical beam 1381 to the reticle 1350, and a detection system 1382 is configured to detect a portion of the interrogation beam as modulated by the reticle 1351. The detected beam can be used as described above to assess reticle distortion so that suitable system adjustments can be made to correct, prevent, or at least partially compensate distortion.

Figure 21:
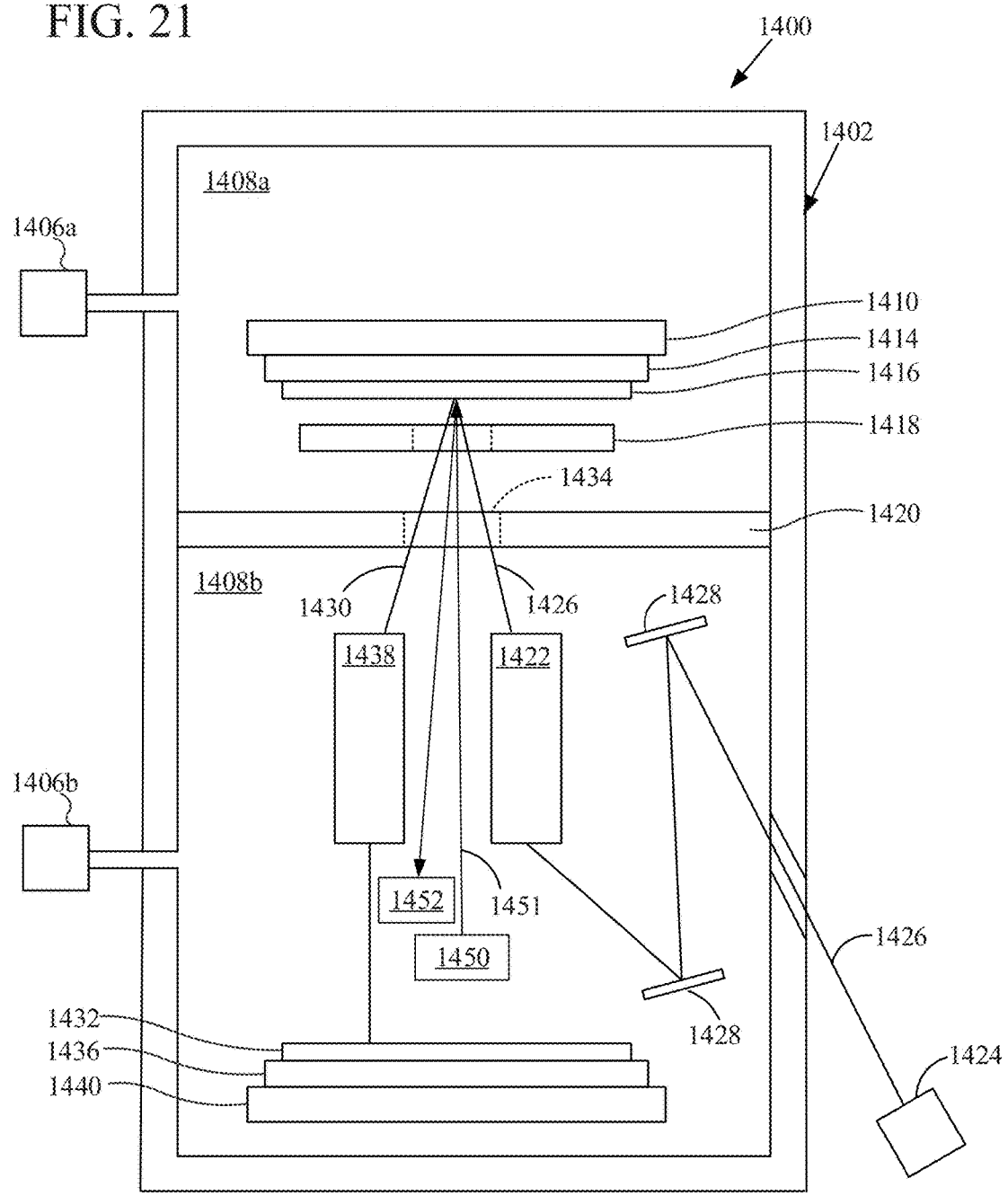
FIG. 21 is a schematic diagram of an extreme-UV microlithography system, which is a second example of a precision system including a stage assembly as described herein.

Referring now to FIG. 21, an alternative embodiment of a precision system that can include the current control system and/or capacitor network as described herein is an EUVL system 1400, as a representative precision system incorporating an electromagnetic actuator as described herein, is shown. The depicted system 1400 comprises a vacuum chamber 1402 including vacuum pumps 1406a, 1406b that are arranged to enable desired vacuum levels to be established and maintained within respective chambers 1408a, 1408b of the vacuum chamber 1402. For example, the vacuum pump 1406a maintains a vacuum level of approximately 50 mTorr in the upper chamber (reticle chamber) 1408a, and the vacuum pump 1406b maintains a vacuum level of less than approximately 1 mTorr in the lower chamber (optical chamber) 1408b. The two chambers 1408a, 1408b are separated from each other by a barrier wall 1420. Various components of the EUVL system 1400 are not shown, for ease of discussion, although it will be appreciated that the EUVL system 1400 can include components such as a reaction frame, a vibration-isolation mechanism, various actuators, and various controllers.

An EUV reticle 1416 is held by a reticle chuck 1414 coupled to a reticle stage 1410. The reticle stage 1410 holds the reticle 1416 and allows the reticle to be moved laterally in a scanning manner, for example, during use of the reticle for making lithographic exposures. Between the reticle 1416 and the barrier wall 1420 is a blind apparatus 1418. An illumination source 1424 produces an EUV illumination beam 1426 that enters the optical chamber 1408b and reflects from one or more mirrors 1428 and through an illumination-optical system 1422 to illuminate a desired location on the reticle 1416. As the illumination beam 1426 reflects from the reticle 1416, the beam is "patterned" by the pattern portion actually being illuminated on the reticle. The barrier wall 1420 serves as a differential-pressure barrier and can serve as a reticle shield that protects the reticle 1416 from particulate contamination during use. The barrier wall 1420 defines an aperture 1434 through which the illumination beam 1426 may illuminate the desired region of the reticle 1416. The incident illumination beam 1426 on the reticle 1416 becomes patterned by interaction with pattern-defining elements on the reticle, and the resulting patterned beam 1430 propagates generally downward through a projection-optical system 1438 onto the surface of a wafer 1432 held by a wafer chuck 1436 on a wafer stage 1440 that performs scanning motions of the wafer during exposure. Hence, images of the reticle pattern are projected onto the wafer 1432.

The wafer stage 1440 can include (not detailed) a positioning stage that may be driven by a planar motor or one or more linear motors, for example, and a wafer table that is magnetically coupled to the positioning stage using an EI-core actuator, for example. The wafer chuck 1436 is coupled to the wafer table, and may be levitated relative to the wafer table by one or more voice-coil motors, for example. If the positioning stage is driven by a planar motor, the planar motor typically utilizes respective electromagnetic forces generated by magnets and corresponding armature coils arranged in two dimensions. The positioning stage is configured to move in multiple degrees of freedom of motion, e.g., three to six degrees of freedom, to allow the wafer 1432 to be positioned at a desired position and orientation relative to the projection-optical system 1438 and the reticle 1416. The current control methods described herein may be applied to either or both of the reticle stage 1410 or the wafer stage 1440.

An EUVL system including the above-described EUV-source and illumination-optical system can be constructed by assembling various assemblies and subsystems in a manner ensuring that prescribed standards of mechanical accuracy, electrical accuracy, and optical accuracy are met and maintained. To establish these standards before, during, and after assembly, various subsystems (especially the illumination-optical system 1422 and projection-optical system 1438) are assessed and adjusted as required to achieve the specified accuracy standards. Similar assessments and adjustments are performed as required of the mechanical and electrical subsystems and assemblies. Assembly of the various subsystems and assemblies includes the creation of optical and mechanical interfaces, electrical interconnections, and plumbing interconnections as required between assemblies and subsystems. After assembling the EUVL system, further assessments, calibrations, and adjustments are made as required to ensure attainment of specified system accuracy and precision of operation. To maintain certain standards of cleanliness and avoidance of contamination, the EUVL system (as well as certain subsystems and assemblies of the system) are assembled in a clean room or the like in which particulate contamination, temperature, and humidity are controlled.

As shown in FIG. 21, an interrogation beam source 1450 can be situated so as to direct an interrogation optical beam 1451 to the reticle 1416. A detection system 1452 is situated to receive at least a portion of the interrogation beam that is reflected, refracted, diffracted, phase-shifted or otherwise modulated by interaction with the reticle 1416. Based on a detector signal response to this beam portion, reticle distortion can be assessed as described above in the detection system.

Figure 22:
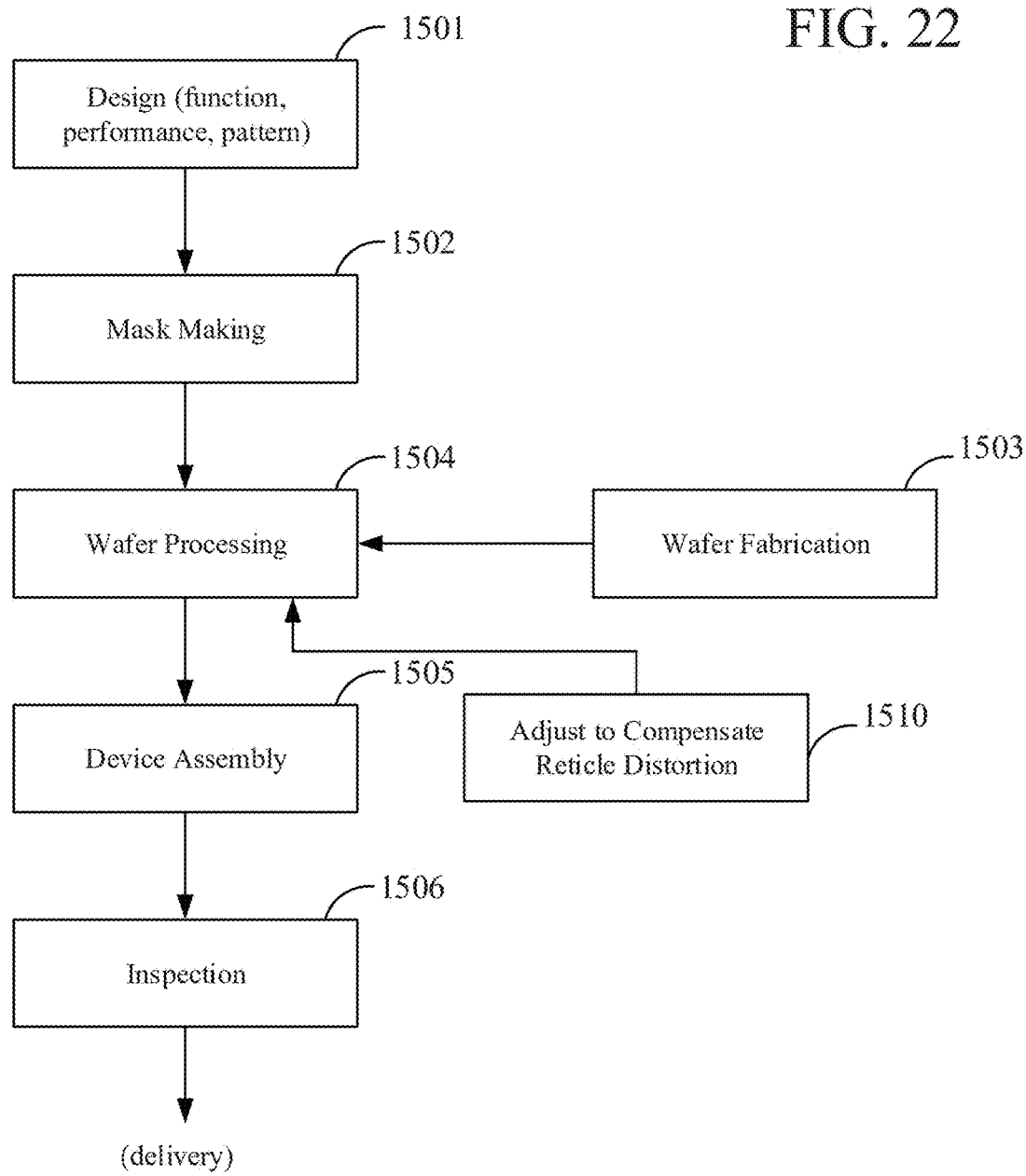
FIG. 22 is a process-flow diagram depicting exemplary steps associated with a process for fabricating semiconductor devices.

Semiconductor devices can be fabricated by processes including microlithography steps performed using a microlithography system as described above. Referring to FIG. 22, in step 1501 the function and performance characteristics of the semiconductor device are designed. In step 1502 a reticle ("mask") defining the desired pattern is designed and fabricated according to the previous design step. Meanwhile, in step 1503, a substrate (wafer) is fabricated and coated with a suitable resist. In step 1504 ("wafer processing") the reticle pattern designed in step 1502 is exposed onto the surface of the substrate using the microlithography system. In a step 1510, reticle distortion can be estimated during exposure as described above. In step 1505 the semiconductor device is assembled (including "dicing" by which individual devices or "chips" are cut from the wafer, "bonding" by which wires are bonded to particular locations on the chips, and "packaging" by which the devices are enclosed in appropriate packages for use). In step 1506 the assembled devices are tested and inspected.

Figure 23:
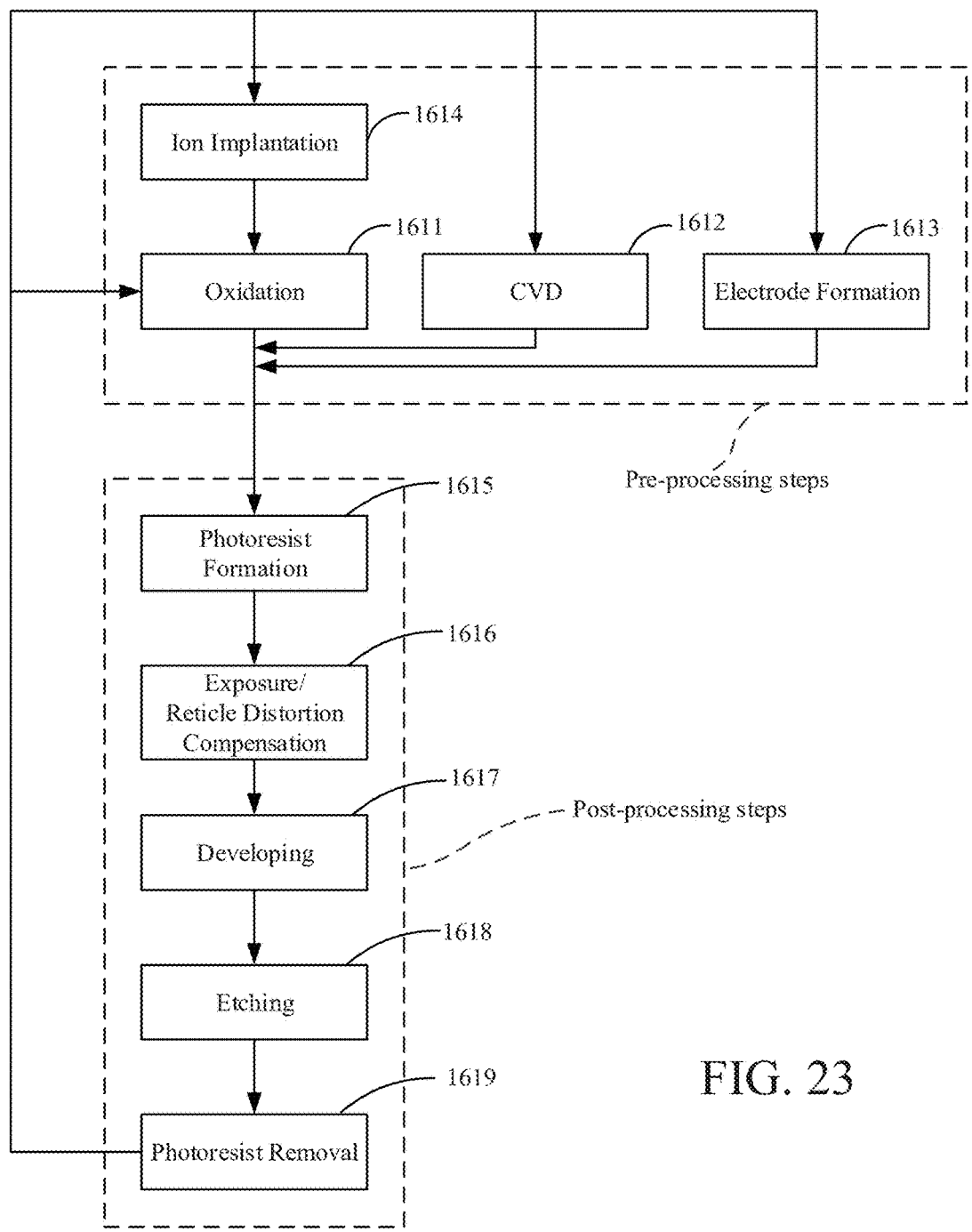
FIG. 23 is a process-flow diagram depicting exemplary steps associated with a processing a substrate (e.g., a wafer), as would be performed, for example, in the process shown in FIG. 22.

Representative details of a wafer-processing process including a microlithography step are shown in FIG. 23. In step 1611 ("oxidation") the wafer surface is oxidized. In step 1612 ("CVD") an insulative layer is formed on the wafer surface by chemical-vapor deposition. In step 1613 (electrode formation) electrodes are formed on the wafer surface by vapor deposition, for example. In step 1614 ("ion implantation") ions are implanted in the wafer surface. These steps 1611-1614 constitute representative "pre-processing" steps for wafers, and selections are made at each step according to processing requirements.

At each stage of wafer processing, when the pre-processing steps have been completed, the following "post-processing" steps are implemented. A first post-process step is step 1615 ("photoresist formation") in which a suitable resist is applied to the surface of the wafer. Next, in step 1616 ("exposure"), the microlithography system described above is used for lithographically transferring a pattern from the reticle to the resist layer on the wafer. Reticle distortion can be compensated during pattern transfer. In step 1617 ("developing") the exposed resist on the wafer is developed to form a usable mask pattern, corresponding to the resist pattern, in the resist on the wafer. In step 1618 ("etching"), regions not covered by developed resist (i.e., exposed material surfaces) are etched away to a controlled depth. In step 1619 ("photoresist removal"), residual developed resist is removed ("stripped") from the wafer.

Formation of multiple interconnected layers of circuit patterns on the wafer is achieved by repeating the pre-processing and post-processing steps as required. Generally, a set of pre-processing and post-processing steps are conducted to form each layer.

Figure 24:
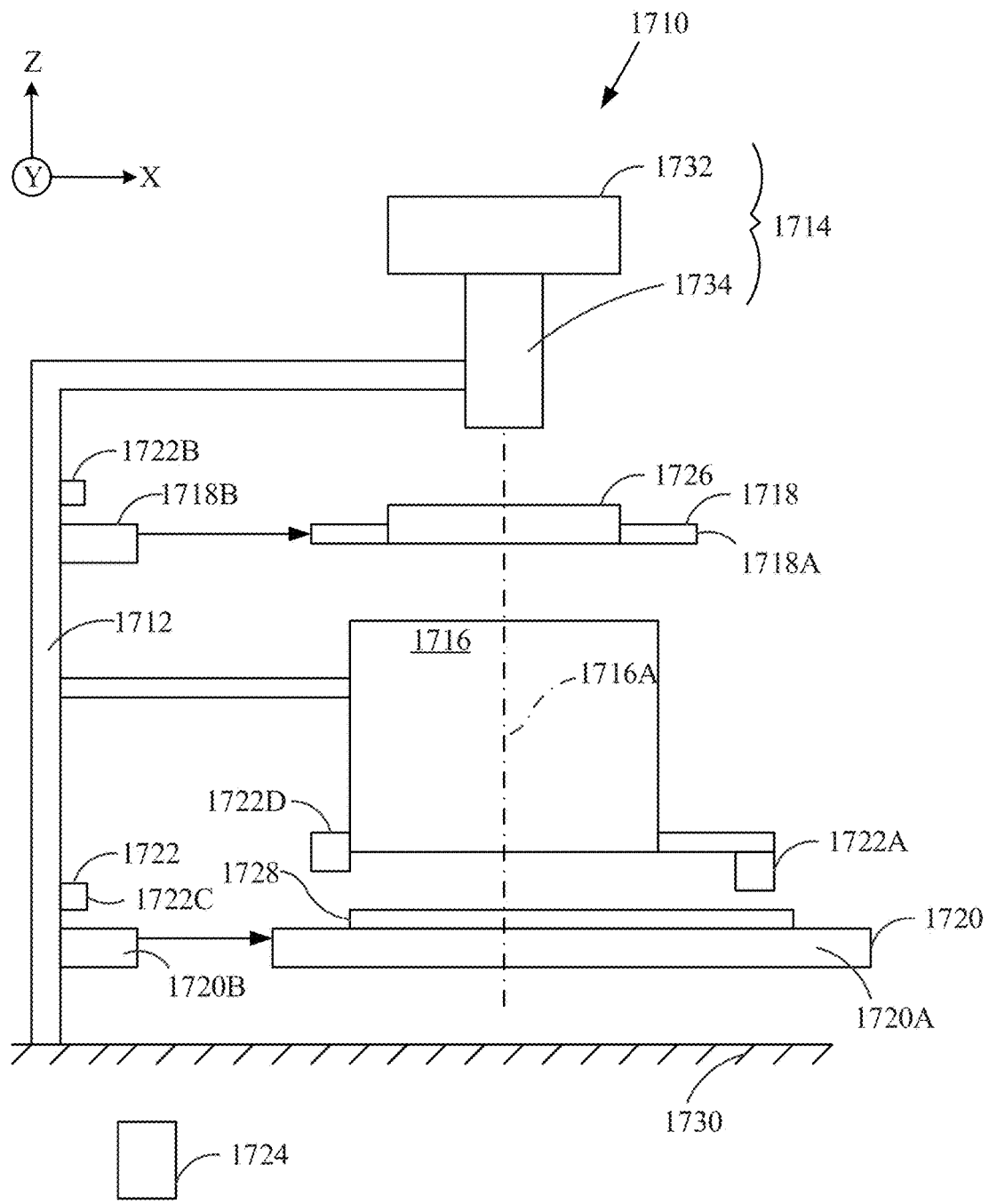
FIG. 24 is a schematic depiction of a microlithography system, as an exemplary precision system, comprising a stage assembly as disclosed herein that includes at least one holding device.

Included in this disclosure are any of various precision systems comprising a stage or the like that holds a workpiece or other item useful in a manufacture. An example of a precision system is a microlithography system or exposure "tool" used for manufacturing semiconductor devices. A schematic depiction of an exemplary microlithography system 1710, comprising features of the invention described herein, is provided in FIG. 24. The system 1710 includes a system or metrology frame 1712, an illumination system 1714, an imaging-optical system 1716, a reticle-stage assembly 1718, a substrate-stage assembly 1720, a positioning system 1722, and a system-controller 1724. The configuration of the components of the system 1710 is particularly useful for transferring a pattern (not shown) of an integrated circuit from a reticle 1726 onto a semiconductor wafer 1728. The system 1710 mounts to a mounting base 1730, e.g., the ground, a base, or floor or other supporting structure. The system also includes a measurement system 1722a that measures the position of a lithographic substrate (as an exemplary workpiece) along an axis (e.g., the z-axis or optical axis) with improved accuracy and precision. In the system 1710, the reticle-stage assembly and/or the substrate-stage assembly 1720 include a current control system and/or a capacitor network as described in the above representative embodiments.

The disclosed methods and apparatus can be applied to the estimation and detection of reticle distortions in lithographic systems such as described above. An optical interrogation beam can be directed to a reticle, and portions of such a beam that are reflected, refracted, diffracted, scattered or otherwise captured by a detector can be used to produce electrical signals indicative of reticle deformation. Typically electrical signals obtained from two or more scans are used, and the interrogation beam can be patterned a magnitude and a direction or the distortion can be estimated.

The above examples are provided in order to illustrate selected embodiments, but the disclosure is not to be limited by features in any particular embodiment.

Representative Computing Environment

Figure 25:
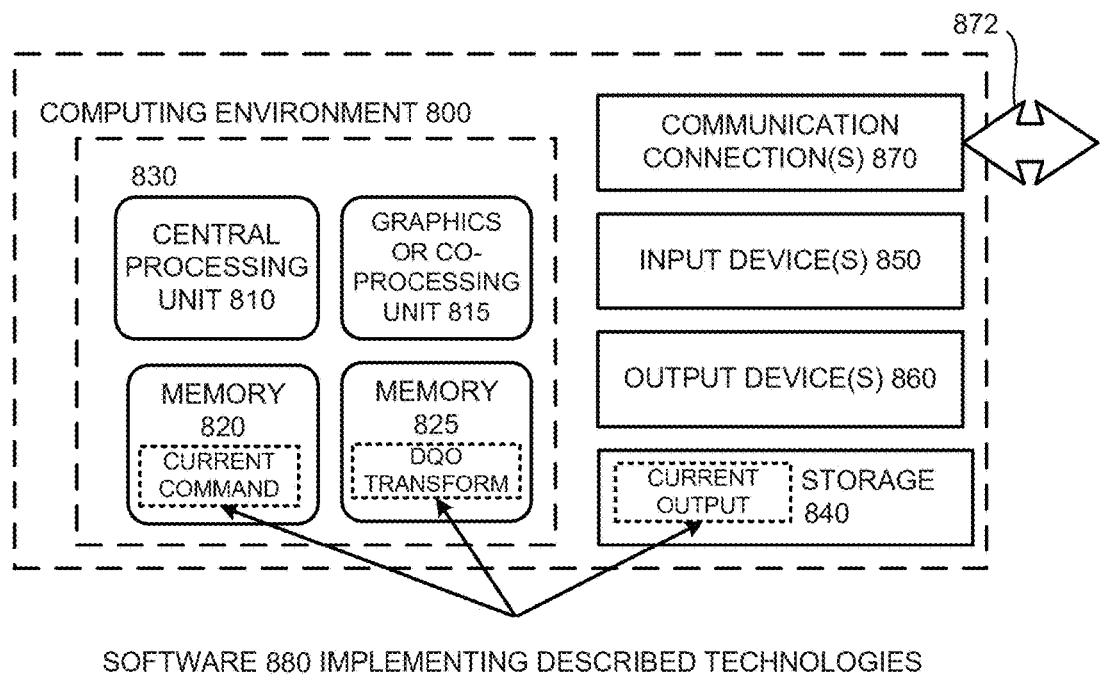
FIG. 25 is a schematic block diagram of a representative computing environment.

FIG. 25 depicts a generalized example of a suitable computing environment 800 in which software and control algorithms for the described technology may be implemented. The computing environment 800 is not intended to suggest any limitation as to scope of use or functionality, as the innovations may be implemented in diverse general-purpose or special-purpose computing systems. For example, the computing environment 800 can be any of a variety of computing devices (e.g., desktop computer, laptop computer, server computer, tablet computer, gaming system, mobile device, programmable automation controller, etc.).

With reference to FIG. 25, the computing environment 800 includes one or more processing units 810, 815 and memory 820, 825 (e.g., for storing data indicative of stage vibration). In FIG. 25, this basic configuration 830 is included within a dashed line. The processing units 810, 815 execute computer-executable instructions. A processing unit can be a general-purpose central processing unit (CPU), a processor in an application-specific integrated circuit (ASIC) or any other type of processor. In a multi-processing system, multiple processing units execute computer-executable instructions to increase processing power. For example, FIG. 25 shows a central processing unit 810 as well as a graphics processing unit or co-processing unit 815. The tangible memory 820, 825 may be volatile memory (e.g., registers, cache, RAM), nonvolatile memory (e.g., ROM, EEPROM, flash memory, etc.), or some combination of the two, accessible by the processing unit(s). The memory 820, 825 stores software 880 implementing one or more innovations described herein, in the form of computer-executable instructions suitable for execution by the processing unit(s).

A computing system may have additional features. For example, in some embodiments, the computing environment 800 includes storage 840, one or more input devices 850, one or more output devices 860, and one or more communication connections 870. An interconnection mechanism (not shown) such as a bus, controller, or network, interconnects the components of the computing environment 800. Typically, operating system software (not shown) provides an operating environment for other software executing in the computing environment 800, and coordinates activities of the components of the computing environment 800.

The tangible storage 840 may be removable or non-removable, and includes magnetic disks, magnetic tapes or cassettes, CD-ROMs, DVDs, or any other medium that can be used to store information in a non-transitory way and can be accessed within the computing environment 800. The storage 840 stores instructions for the software 880 implementing one or more innovations described herein (e.g., for storing data of a trajectory of a wafer stage).

The input device(s) 850 may be, for example: a touch input device, such as a keyboard, mouse, pen, or trackball; a voice input device; a scanning device; any of various sensors; another device that provides input to the computing environment 800; or combinations thereof. For video encoding, the input device(s) 850 may be a camera, video card, TV tuner card, or similar device that accepts video input in analog or digital form, or a CD-ROM or CD-RW that reads video samples into the computing environment 800. The output device(s) 860 may be a display, printer, speaker, CD-writer, or another device that provides output from the computing environment 800.

The communication connection(s) 870 enable communication over a communication medium to another computing entity. The communication medium conveys information, such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

Any of the disclosed methods can be implemented as computer-executable instructions stored on one or more computer-readable storage media (e.g., one or more optical media discs, volatile memory components (such as DRAM or SRAM), or nonvolatile memory components (such as flash memory or hard drives)) and executed on a computer (e.g., any commercially available computer, including smart phones, other mobile devices that include computing hardware, or programmable automation controllers). The term computer-readable storage media does not include communication connections, such as signals and carrier waves. Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in C, C++, Java, Perl, JavaScript, Adobe Flash, or any other suitable programming language. Likewise, the disclosed technology is not limited to any particular computer or type of hardware. Certain details of suitable computers and hardware are well known and need not be set forth in detail in this disclosure.

It should also be well understood that any functionality described herein can be performed, at least in part, by one or more hardware logic components, instead of software. For example, and without limitation, illustrative types of hardware logic components that can be used include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), etc.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

General Considerations

For purposes of this description, certain aspects, advantages, and novel features of the embodiments of this disclosure are described herein. The disclosed methods, apparatus, and systems should not be construed as being limiting in any way. Instead, the present disclosure is directed toward all novel and nonobvious features and aspects of the various disclosed embodiments, alone and in various combinations and sub-combinations with one another. The methods, apparatus, and systems are not limited to any specific aspect or feature or combination thereof, nor do the disclosed embodiments require that any one or more specific advantages be present or problems be solved.

Although the operations of some of the disclosed embodiments are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods. Additionally, the description sometimes uses terms like "provide" or "achieve" to describe the disclosed methods. These terms are high-level abstractions of the actual operations that are performed. The actual operations that correspond to these terms may vary depending on the particular implementation and are readily discernible by one of ordinary skill in the art.

As used in this application and in the claims, the singular forms "a," "an," and "the" include the plural forms unless the context clearly dictates otherwise. Additionally, the term "includes" means "comprises." Further, the terms "coupled" and "associated" generally mean electrically, electromagnetically, and/or physically (e.g., mechanically or chemically) coupled or linked and does not exclude the presence of intermediate elements between the coupled or associated items absent specific contrary language.

In some examples, values, procedures, or apparatus may be referred to as "lowest," "best," "minimum," or the like. It will be appreciated that such descriptions are intended to indicate that a selection among many alternatives can be made, and such selections need not be better, smaller, or otherwise preferable to other selections.

In the following description, certain terms may be used such as "up," "down," "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object.

In view of the many possible embodiments to which the principles of the disclosed technology may be applied, it should be recognized that the illustrated embodiments are only preferred examples and should not be taken as limiting the scope of the disclosure. Rather, the scope of the disclosure is defined by the following claims.

What is claimed is:

1. A method for controlling a motor, comprising:
   with a first summing junction of a controller, summing a first signal indicative of an output current of the motor with a current command signal to obtain a summed current command signal;
   with an integration module of the controller, integrating the summed current command signal with respect to time to obtain an integrated current command signal;

with a first gain module of the controller, applying a first controller gain to a second signal indicative of the output current of the motor to obtain a gain-controlled signal indicative of the output current of the motor;

with a second gain module of the controller, applying a second controller gain to the integrated current command signal to obtain a gain-controlled current command signal;

with a second summing junction of the controller, summing the gain-controlled signal indicative of the output current of the motor with the gain-controlled current command signal to compensate for back electromotive force generated in the motor and obtain a voltage signal; and inputting the voltage signal to the motor such that current amplitudes in the motor are controlled.

2. The method of claim 1, wherein the current command signal is a direct-axis current command signal or a quadrature-axis current command signal.

3. The method of claim 2, further comprising applying an inverse direct-quadrature-zero transformation to the voltage signal.

4. The method of claim 2, further comprising applying a direct-quadrature-zero transformation to the signal indicative of the output current of the motor.

5. The method of claim 1, wherein the motor is a planar motor, a linear motor, or a rotational motor.

6. The method of claim 1, wherein the motor is cryogenically cooled.

7. The method of claim 1, wherein the first controller gain is defined in terms of at least one of an inductance of a coil of the motor, a resistance of the coil, a damping ratio of a system dynamics of the motor, a natural frequency of the system dynamics of the motor, or any combination thereof.

8. The method of claim 1, wherein the second controller gain is defined in terms of at least one of the inductance of the coil and a natural frequency of a system dynamics of the motor, or any combination thereof.

9. The method of claim 1, wherein:
the first and second controller gains are quadrature-axis controller gains; and
further comprising applying a first direct-axis controller gain to a direct-axis current command; and
applying a second direct-axis controller gain to a signal indicative of a direct-axis current output of the motor.

10. The method of claim 9, wherein the first and second direct-axis controller gains are defined in terms of at least one of an inductance of a coil of the motor, a resistance of the coil, a damping ratio of a system dynamics of the motor, a natural frequency of the system dynamics of the motor, or any combination thereof.

11. One or more non-transitory computer readable media having stored thereon instructions for causing the controller to perform the method of claim 1.

12. A precision system including the controller operable to perform the method of claim 1.

13. A system, comprising:
a motor; and
a controller, comprising:
a first summing junction operable to sum a signal indicative of an output current of the motor with a current command signal to obtain a summed current command signal;
an integration module operable to integrate the summed current command signal with respect to time;
a first gain module to apply a first controller gain to a second signal indicative of the output current of the motor to obtain a gain-controlled signal indicative of the output current of the motor;
a second gain module to apply a second controller gain to the output of the integration module to obtain a gain-controlled current command signal; and
a second summing junction to sum the gain-controlled signal indicative of the output current of the motor with the gain-controlled current command signal to compensate for back electromotive force generated in the motor and output a voltage signal to the motor.

14. The system of claim 13, further comprising an inverse direct-quadrature-zero transformation module to apply an inverse direct-quadrature-zero transformation to the voltage signal.

15. The system of claim 13, further comprising a direct-quadrature-zero transformation module to apply a direct-quadrature-zero transformation to the signal indicative of the current output of the motor.

16. The system of claim 13, wherein the motor is cryogenically cooled.

17. The system of claim 13, wherein the first controller gain is defined in terms of at least one of an inductance of a coil of the motor, a resistance of the coil, a damping ratio of a system dynamics of the motor, a natural frequency of the system dynamics of the motor, or any combination thereof.

18. The system of claim 13, wherein the second controller gain is defined in terms of at least one of the inductance of the coil and a natural frequency of a system dynamics of the motor, or any combination thereof.

19. The system of claim 13, wherein:
the controller is further configured to multiply a third signal indicative of the output current of the motor with at least one of an angular velocity of the motor, a number of pole pairs of the motor, and an inductance of the motor to obtain a multiplied third signal indicative of the output current of the motor; and
the controller further comprises a third summing junction to sum the multiplied third signal indicative out of the output current of the motor with an output of the second summing junction.

20. The system of claim 13, wherein the first gain module and the second gain module are integrating operational amplifiers.

* * * * *